United States Patent
Nakamura et al.

(10) Patent No.: US 7,880,364 B2
(45) Date of Patent: Feb. 1, 2011

(54) PARAMETRIC RESONATOR AND FILTER USING THE SAME

(75) Inventors: Kunihiko Nakamura, Osaka (JP); Hideki Kawakatsu, Tokyo (JP)

(73) Assignees: Panasonic Corporation, Osaka (JP); The University of Tokyo, Tokyo (JP)

( * ) Notice: Subject to any disclaimer, the term of this patent is extended or adjusted under 35 U.S.C. 154(b) by 532 days.

(21) Appl. No.: 11/668,494

(22) Filed: Jan. 30, 2007

(65) Prior Publication Data

US 2007/0176701 A1    Aug. 2, 2007

(30) Foreign Application Priority Data

Jan. 31, 2006   (JP)  ............... 2006-022576
Jan. 25, 2007   (JP)  ............... 2007-015123

(51) Int. Cl.
    *H02N 1/00*      (2006.01)
(52) U.S. Cl. .................................................. 310/309
(58) Field of Classification Search ............... 310/311, 310/306, 309, 323.02; 333/71–76
See application file for complete search history.

(56) References Cited

U.S. PATENT DOCUMENTS

| | | | | |
|---|---|---|---|---|
| 5,229,678 A | * | 7/1993 | Miyazawa | ............. 310/323.08 |
| 6,497,141 B1 | * | 12/2002 | Turner et al. | ................... 73/105 |
| 6,900,575 B2 | * | 5/2005 | Olkhovets et al. | ........... 310/309 |
| 7,005,775 B2 | * | 2/2006 | Wan | ........................... 310/309 |
| 7,034,370 B2 | * | 4/2006 | Kuo | ........................... 257/414 |
| 7,342,346 B2 | * | 3/2008 | Kim et al. | .................... 310/309 |
| 7,453,183 B2 | * | 11/2008 | Zettl et al. | .................. 310/309 |
| 7,468,572 B2 | * | 12/2008 | Thomas | ...................... 310/309 |

OTHER PUBLICATIONS

Zhang et al., "Changing the Behavior of Parametric Resonance in MEMS Oscillators by Tuning the Effective Cubic Stiffness", IEEE, 2003, pp. 173-176.

Napoli et al,. "Understanding Mechanical Domain Parametric Resonance in Microcantilevers", IEEE, 2003, pp. 169-172.

* cited by examiner

*Primary Examiner*—Mark Budd
(74) *Attorney, Agent, or Firm*—Pearne & Gordon LLP

(57) ABSTRACT

A resonator includes a vibrator that performs mechanical vibration, an exciting unit that applies an exciting force to the vibrator, and a modulating unit that modulates a spring property of the vibrator. The vibrator vibrates when the exciting force is applied to the vibrator from the exciting unit. The modulating unit modulates the vibrator according to the exciting force.

22 Claims, 13 Drawing Sheets

33: SILICON NITRIDE LAYER
32: SINGLE CRYSTAL SILICON LAYER
31: SILICON OXIDE LAYER
30: SILICON SUBSTRATE

37: POLYSILICON

2a: ELECTRODE    2b: ELECTRODE

35: SILICON OXIDE LAYER
31: SILICON OXIDE LAYER

1: VIBRATOR
2a: ELECTRODE    2b: ELECTRODE
UNDER-ETCHING

36: SILICON OXIDE LAYER

PARAMETRIC RESONATOR AND FILTER USING THE SAME

BACKGROUND OF THE INVENTION

The present invention relates to a resonator and a filter using the same. More specifically, the invention relates to a technology for implementing an electro-mechanical filter circuit having high performance by using mechanical resonance, in an electrical circuit which is integrated in the high density.

A mechanical resonator according to the related art will be described with reference to FIG. 15. FIG. 15 is a diagram illustrating a simplified structure of a mechanical vibration filter (see Non-Patent Document 1) using flexible vibration.

The mechanical vibration filter according to the related art is obtained by forming a pattern on a silicon substrate by means of a thin film forming process. The mechanical vibration filter includes an input line 104, an output line 105, both-end supported beams 101 and 102 which are disposed with a gap of 1 micron or less with respect to the respective lines 104 and 105, and a coupling beam 103 which couples the two both-end supported beams 101 and 102. In addition, an input signal is input to the input line 104. The signal which is input to the input line 104 is capacitively coupled with the both-end supported beam 101 and generates an electrostatic force in the both-end supported beam 101. In only a case when a frequency of the input signal is approximately equal to a resonance frequency of an elastic structure including the both-ended supported beams 101 and 102 and the coupling beam 103, mechanical vibration is excited. Further, the mechanical vibration is detected as a variation in capacitance between the output line 105 and the both-end supported beam 102, which extracts an output signal obtained by filtering the input signal.

In the case of a both-end supported beam having a rectangular section, if the elastic modulus is set to E, the density is set to $\rho$, the thickness is set to h, and the length is set to L, a resonance frequency f of flexible vibration is represented as the following Equation.

$$f = 1.03 \frac{h}{L^2} \sqrt{\frac{E}{\rho}} \qquad \text{[Equation 1]}$$

In the case where a polysilicon material is used, if the conditions E=160 GPa, $\rho$=2.2×10$^3$ kg/m$^3$, L=40 μm, and h=1.5 μm are set, f becomes 8.2 MHz, and thus a filter of a band of about 8 MHz can be formed. As compared with a filter that is composed of a passive circuit, such as a capacitor or a coil, since the mechanical resonance filter uses mechanical resonance, it is possible to obtain steep frequency selection characteristics with a high Q value.

However, in the above-described structure, in forming a filter of a high frequency band, the following restriction exists. That is, as apparent from Equation 1, it is preferable that a material capable of increasing E/$\rho$ is first used. However, if E is increased, even though a force bending the beam is the same, the displacement of the beam may be smaller. As a result, it becomes difficult to detect the displacement of the beam. Further, if the index indicating the flexibility of the beam is set to a ratio d/L between the bent amount d of the central portion of the beam and the length L of the beam when a static load is applied to the surface of the both-ended beam, d/L can be represented by a proportional relationship of the following Equation.

$$\frac{d}{L} \propto \frac{L^3}{h^3} \cdot \frac{1}{E} \qquad \text{[Equation 2]}$$

From this point, in order to raise the resonance frequency while the d/L value is maintained, a material having small density $\rho$ needs to be selected without changing at least E. As a material that has small density in the same Young's modulus as the polysilicon, it is necessary to use a composite material, such as CFRP (Carbon Fiber Reinforced Plastics). In this case, it becomes difficult to form a minute mechanical vibration filter with a semiconductor process.

Accordingly, as a second method in which the above-described composite material is not used, there is a method in which the dimension of the beam is changed to increase h·L$^{-2}$ in Equation 1. However, the increase of the thickness h of the beam and the decrease of the length L of the beam may decrease d/L in Equation 2, which is the index of the flexibility. As a result, it becomes difficult for the flexibility of the beam to be detected.

If the relationship between log (L) and log (h) is shown in FIG. 16 in regards to Equations 1 and 2, a straight line 191 indicates a relationship that is calculated from Equation 1 and a straight line 192 indicates a relationship that is calculated from Equation 2. In FIG. 16, if setting L and h in a range (region A) on the straight line of the inclination '2' on the basis of the current dimension A, f is increased, and if setting L and h in a range (region B) below the straight line of the inclination '1' on the basis of the current dimension A, d/L is increased. Accordingly, in FIG. 16, the hatched portion (region C) indicates a range of L and h where the resonance frequency can be raised while the bent amount of the beam is ensured.

It can be apparent from FIG. 16 that, when the frequency of the mechanical vibration filter increases, the decrease in the length L of the beam and the thickness h of the beam becomes necessary conditions, and the decrease of L and h by the same scale ratio, that is, the decrease of L and h while L and h cross the straight line of the inclination '1' becomes a sufficient condition of the hatched portion of FIG. 16. As such, in the mechanical resonator according to the related art, the dimension of the mechanical vibrator is reduced and thus resonance frequency is increased.

[Non-Patent Document 1] Frank D. Bannon III, John R. Clark, and Clark T.-C. Nguyen, "High-Q HF Microelectromechanical Filters", IEEE Journal of Solid-State Circuits, Vol. 35, No. 4, pp. 512-526, April 2000.

However, if the size of the mechanical vibrator is reduced, even though the relative ratio of d and L can be ensured, the absolute amount of d is extremely reduced. It means that at the same time as the capacitance between the electrode and the vibrator being extremely reduced, the variation in the capacitance due to the vibration becomes extremely reduced. A parasitic capacitance that is parasitic in parallel to the capacitance between the electrode and the vibrator is almost constant without depending on the size of the mechanical vibrator. If the parasitic capacitance becomes larger than the capacitance between the electrode and the vibrator, when the mechanical vibrator becomes smaller, the variation in electrical impedance of the vibrator at the resonance point may be smaller. As a result, the sensitivity is lowered, and a filter operation becomes insufficient.

Accordingly, as disclosed in Non-Patent Document 2 or 3, a method has been investigated in which amplitude of a vibrator is increased by using parametric resonance. That is, in addition to an exciting force applied to the vibrator from the outside, modulation is performed on a spring property of the vibrator or mass, which allows an effect of amplifying amplitude near a resonance point. The description is made using the related art shown in FIG. 15. If the vibration of the both-ended beams 101 and 102 of the resonator is amplified, since a current proportional to the vibration velocity flows through the output line 105, it is possible to obtain an output signal having a superior S/N ratio. When the vibrator is very tiny, that is, when a frequency at the vibrator is increased, it contributes to attain the effect.

Accordingly, as disclosed in Non-Patent Document 2 or 3, analysis of occurrence conditions of the uncontrollable oscillation state or non-linear jump of the vibration spectrum has been investigated. The phenomenon, such as the uncontrollable oscillation or non-linear jump, is inappropriate when the resonator is applied to the filter. Further, the consideration is not being made in terms of whether an optimal value exists in the relationship between the modulation of the spring property and the phase of the external exciting force.

SUMMARY OF THE INVENTION

The invention has been made to solve the above-described problems, and it is an object of the invention to a resonator that has the relationship between the external exciting force and the phase of the modulation of the spring property adjusted to effectively increase the vibration amplitude by using parametric resonance where modulation is applied to a spring property of the vibrator, while excluding the use in a state that is not preferable as a filter operation, as in uncontrollable oscillation or non-linear spectrum.

[Non-Patent Document 2] Mariateresa Napoli, Rajashree Baskaran, Kimberly Tuner and Bassam Bamieh, "Understanding Mechanical Domain Parametric Resonance in Microcantilevers", Proc. of IEEE MEMS2003, pp. 169-172, 2003.

[Non-Patent Document 3] Wenhua Zhang, Rajashree Baskaran and Kimberly L. Turner, "Changing the Behavior of Parametric Resonance in MEMS Oscillators by Tuning the Effective Cubic Stiffness", Proc. of IEEE MEMS 2003, pp. 173-175, 2003.

In order to achieve the above-mentioned object, according to an aspect of the invention, a resonator includes a vibrator that performs mechanical vibration, an exciting unit that applies an exciting force to the vibrator, and a modulating unit that modulates a spring property of the vibrator. The vibrator vibrates when the exciting force is applied to the vibrator from the exciting unit, and the modulating unit modulates the vibrator according to the exciting force.

According to this structure, in a state where the exciting force is not applied to the vibrator, the vibrator does not vibrate, and when the exciting force is applied to the vibrator from the exciting unit, the vibrator is excited. The modulating unit modulates the vibrator according to the exciting force such that the relationship between the external exciting force and the phase of the modulation of the spring property effectively causes an increase in the vibration amplitude, and the vibration amplitude can be increased by the parametric resonance.

Further, the modulation means that the spring property is cyclically varied on the basis of an arbitrary value.

In the resonator according to the aspect of the invention, the modulating unit may modulate a spring property of the vibrator according to a cycle of the exciting force from the exciting unit.

According to this structure, the vibration amplitude can be effectively increased by the parametric resonance. Further, the spring property of the vibrator can be adjusted according to the phase of the exciting force. If the modulation of the spring property is applied to the vibrator at the optimal phase according to the cycle of the exciting force, the vibration amplitude can be increased, which achieves high sensitivity.

In the resonator according to the aspect of the invention, a modulation frequency of the spring property of the vibrator may be the same as a frequency of the exciting force from the exciting unit.

According to this structure, it is possible to modulate the spring property of the vibrator with a simple structure.

In the resonator according to the aspect of the invention, the exciting unit may apply the exciting force to the vibrator such that the cyclic exciting force from the exciting unit has a value proportional to $\sin \omega t$, the modulating unit may modulate the spring property such that an increment of the spring property is in proportion to $\cos(\omega t+\phi)$. At this time, a phase $\phi$ may be in a range of $-22.5°$ to $112.5°$ or a range of $157.5°$ to $292.5°$.

According to this structure, it could be understood from the experimental result that the vibration can be effectively amplified by using the above-described structure.

In the resonator according to the aspect of the invention, the phase may be approximately $45°$ or $225°$.

According to this structure, the vibration can be maximally amplified.

In the resonator according to the aspect of the invention, a modulation frequency of the spring property of the vibrator may be two times as much as a frequency of the exciting force from the exciting unit.

According to this structure, it is possible to obtain resonance near a resonance frequency of when the spring property is not modulated.

In the resonator according to the aspect of the invention, the exciting unit may apply the exciting force to the vibrator such that a cyclic exciting force from the exciting unit has a value proportional to $\sin \omega t$, the modulating unit modulates the spring property such that an increment of the spring property is in proportion to $\cos(2\omega t+\phi)$. At this time, a phase $\phi$ may be in a range of $-225°$ to $45°$.

According to this structure, it could be understood from the experimental result that the vibration can be effectively amplified by using the above-described structure.

In the resonator according to the aspect of the invention, the phase $\phi$ may be approximately $-90°$.

According to this structure, the vibration can be maximally amplified.

In the resonator according to the aspect of the invention, in a case where a cyclic exciting force from the exciting unit has a value proportional to $\sin \omega t$ and a resonance angular frequency of when the spring property is not modulated is $\omega 0$, the modulating unit may modulate the spring property such that an increment of the spring property is in proportion to $\cos 2\omega(t-D)$ having a delay time D, and the delay time D may be in a range of 0 to 0.625 times as large as $2\pi/(2\omega_0)$ or in a range of 0.875 to 1 times as large as $2\pi/(2\omega_0)$.

According to this structure, it is possible to obtain resonance near a resonance frequency of when the spring property is not modulated.

In the resonator according to the aspect of the invention, the delay time D may be approximately 0.25 times as large as $2\pi/(2\omega_0)$.

According to this structure, the vibration can be maximally amplified.

In the resonator according to the aspect of the invention, the exciting unit may be an electrode that is disposed to be adjacent to the vibrator and converts a variation in voltage between the vibrator and the electrode into the exciting force applied to the vibrator.

According to this structure, the resonator and a filter can be achieved by a processing method that has high affinity with the semiconductor process.

In the resonator according to the aspect of the invention, the modulating unit may include a temperature control unit that controls a temperature of the vibrator and modulates the spring property according to the variation in the temperature of the vibrator.

According to this structure, it is possible to apply modulation to the spring property of the vibrator in a non-contact state.

In the resonator according to the aspect of the invention, the temperature control unit may generate the time variation in the temperature of the vibrator by light radiation.

According to this structure, it is possible to isolate the modulating unit and the resonator from each other, which reduces a noise in the resonator. Further, since the amount of absorbed light is different according to the wavelength of the light in the material of the vibrator, it is possible to adjust the modulation degree of the spring property by selecting the wavelength of the light.

In the resonator according to the aspect of the invention, the light radiating unit may include a light source and a mirror, such that light radiated from the light source passes through the vibrator, is reflected on the mirror, and is incident on the vibrator.

According to this structure, the variation in the temperature in the vibrator can be reduced and the temperature modulation on the entire vibrator can be performed, which applies the modulation to the spring property of the vibrator without causing unnecessary vibration due to the variation in the temperature. Accordingly, the light can be effectively radiated onto the vibrator. Further, it is possible to modulate the spring property by modulating stress by energy (mainly, heat energy) generated when the light is radiated at a predetermined timing. Further, since the modulation can be performed on the spring property by controlling on/off characteristics of the light, the wavelength and the intensity of the light, or the like, the switching characteristic is very excellent, and the controllability with respect to the modulation timing is also very excellent.

In the resonator according to the aspect of the invention, the light radiating unit may include a laser diode provided at one end of the vibrator and a mirror provided at the other end thereof, and may radiate a laser beam from the one end of the vibrator to the other end thereof along a longitudinal direction of the vibrator and perform an optical pumping.

According to this structure, since the modulation on the spring property is performed by radiating the laser beam, it is possible to perform modulation on the spring property with high controllability, which provides a parametric resonator that has high efficiency.

In the resonator according to the aspect of the invention, the vibrator may be constructed such that peripheral portions of the vibrator other than both ends thereof are surrounded by a region where refractive index is smaller than a refractive index of the vibrator.

According to this structure, it is possible to confine the light in the vibrator. Therefore, it is possible to modulate the light with high efficiency.

In the resonator according to the aspect of the invention, the vibrator may have both ends where source and drain regions are respectively formed, the longitudinal direction of the vibrator may be used as a channel, a gate electrode may be formed at a predetermined gap from the channel, and the gate electrode may be formed of a metal or a polycide metal to form a reflective surface.

According to this structure, the gate electrode is formed of the metal or the polycide metal that is the reflective material, and thus the laser beam or the like is radiated from the side of the back surface of the vibrator, that is, the surface of the vibrator facing the gate electrode. Therefore, it is possible to uniformly perform light modulation over the entire vibrator in a longitudinal direction with high controllability.

In the resonator according to the aspect of the invention, the temperature control unit may include a current control unit that controls an amount of current supplied to the vibrator and controls the temperature of the vibrator using Joule heat.

According to this structure, since the temperature of the vibrator is controlled in accordance to the variation in Joule's heat due to the current that flows through the vibrator, it is possible to construct a parametric resonator having high efficiency with a simple structure.

In the resonator according to the aspect of the invention, the vibrator may have fixed portions or supporting portions at two locations or more, and may use peripheral portions of the fixed portions or the supporting portions as vibration nodes.

According to this structure, stress can be accumulated in the vibrator between the fixed portions or the supporting portions, and the modulating unit modulates the stress to perform the modulation on the spring property.

In the resonator according to the aspect of the invention, the vibrator may be a both-end supported beam.

According to this structure, it is possible to form a resonator with a simple structure.

In the resonator according to the aspect of the invention, at least the vibrator may be sealed in a vacuum.

According to this structure, since the vibrator is accommodated in the case that is sealed in vacuum atmosphere, it is possible to reduce a phenomenon that the viscosity of the ambient gas obstructs the vibration of the vibrator.

According to another aspect of the invention, there is provided an electro-mechanical filter using the above-described resonator.

According to the structure of the resonator according to the aspect of the invention, since the vibration of the vibrator due to the external exciting force can be further amplified, the mechanical resonance can be electrically detected with high sensitivity. Even when using a small-sized vibrator that is used in a band of several hundred MHz to several GHz, a filter function can be provided.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Hereinafter, the preferred embodiments of the invention will be described in detail with reference to the accompanying drawings.

First Embodiment

Figure 1A:
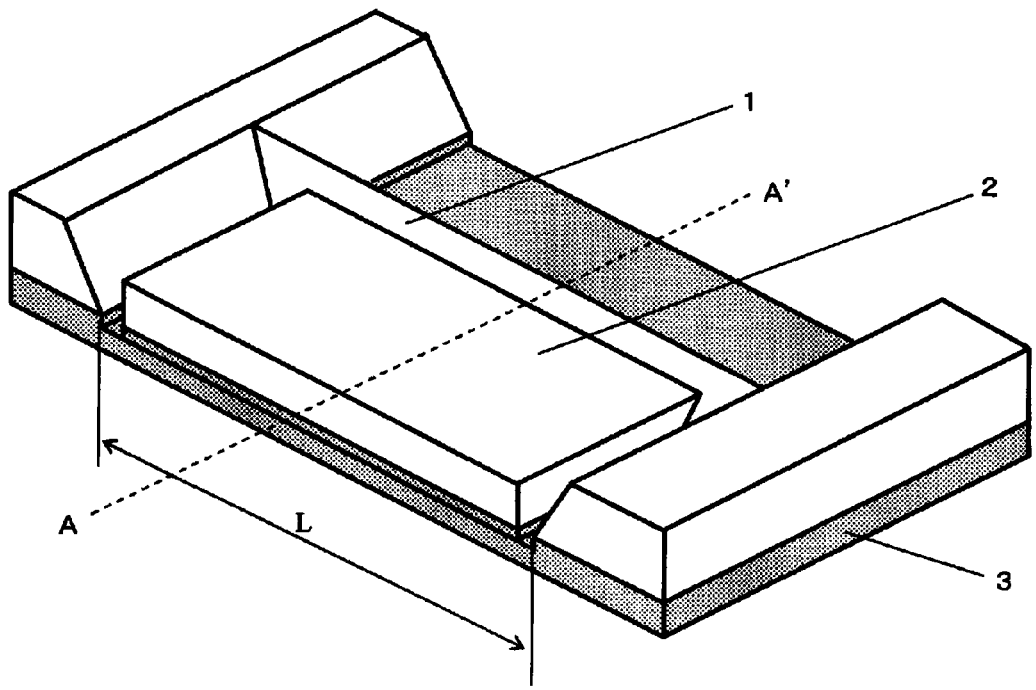
FIG. 1A is a perspective view illustrating a torsional resonator according to a first embodiment of the invention and FIG. 1B is a cross-sectional view illustrating a torsional resonator according to a first embodiment of the invention.

FIG. 1A is a perspective view illustrating a resonator according to a first embodiment of the invention. The resonator according to the first embodiment is a torsional resonator. The resonator includes a beam-typed vibrator 1 that performs torsional vibration and an electrode 2 that is disposed to be adjacent to the beam-typed vibrator 1 at a predetermined gap with respect to the side of the beam-typed vibrator 1. The resonator is constructed such that a spring property of the beam-typed vibrator 1 is modulated according to a cycle of an exciting force with sectional shapes of the electrode 2 and the beam-typed vibrator 1, by radiating a laser beam using a semiconductor laser, as shown in FIG. 3. The resonator can effectively increase an amplitude by parametric resonance.

In this case, the beam-typed vibrator 1 is a both-end supported beam whose both ends are fixed. The beam-typed vibrator 1 is made of single crystal silicon material. The beam-typed vibrator 1 has a thickness tb of 200 nm, a length L of 1.4 μm, an equivalent mass of $1 \times 10^{-17}$ kg, an equivalent spring constant of 1 kN/m, and a torsional vibration basic mode of about 1.6 GHz.

Figure 1B:
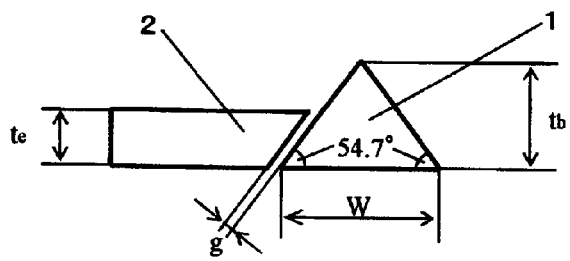

The cross sections of the beam-typed vibrator 1 and the electrode 2 taken along the line A-A' bin FIG. 1A are shown in FIG. 1B. The beam-typed vibrator 1 has a section that is shaped in an isosceles triangle. In the beam-typed vibrator 1, a width W is 284 nm, and an angle between the bottom side and the other sides is 54.7°. A gap g of 10 nm is formed between the beam-typed vibrator 1 and the electrode 2, and capacitance C is formed therebetween. In this case, a bottom surface of the electrode 2 aligns with a bottom surface of the beam-typed vibrator 1, and its thickness te is set to 0.12 μm. The resonator is a resonator that uses an electrostatic force as an exciting force. The electrode 2 functions as an exciting portion.

A band pass filter using the resonator will be described with reference to FIG. 2. For convenience of explanation, in FIG. 2, the electrodes 2 of FIG. 1A are symmetrically disposed with the beam-typed vibrator 1 interposed therebetween, and conversion is made in the order of a voltage, mechanical vibration, and a current by using one vibrator and two electrodes.

In this case, if a DC voltage Vp and an input alternating current voltage v are applied between the electrode 2a and the beam-typed vibrator 1 to overlap each other, an electrostatic force F, which is applied to the beam-typed resonator with a frequency of an alternating current signal v, satisfies the condition $F = v \cdot V_p \cdot \Delta C / \Delta x$. Here, C indicates capacitance between the electrode 2a and the beam-typed vibrator 1, and x indicates a displacement according to torsional vibration of the beam-typed vibrator 1.

Figure 2:
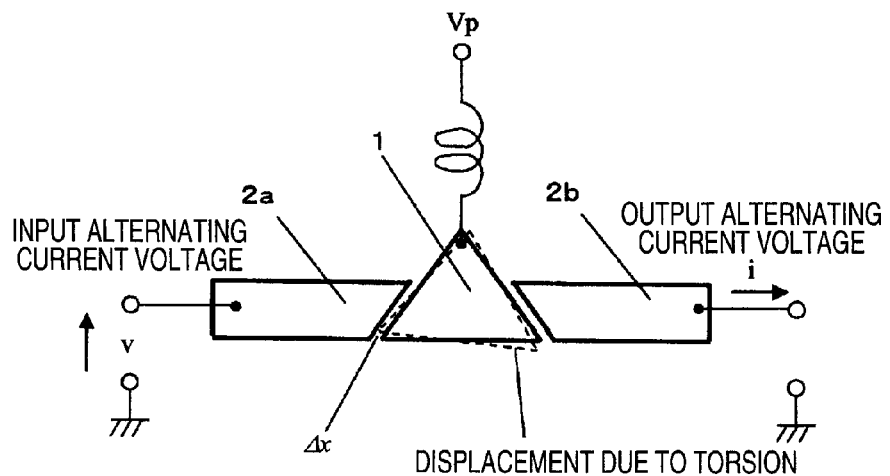
FIG. 2 is a diagram illustrating an electromechanical conversion in a torsional resonator according to a first embodiment of the invention.

In FIG. 2, an alternating current i, which is generated at an output electrode 2b by the beam-typed resonator performing the torsional vibration, satisfies the condition $i = V_p \cdot (dx/dt) \cdot \Delta C / \Delta x$. Since the alternating current i is in proportion to the vibration velocity dx/dt, the vibration velocity dx/dt becomes maximized at a resonance frequency of 1.6 GHz in the torsional vibration. At this time, the maximum output signal can be obtained. Therefore, the resonator functions as a band pass filter that uses a resonance frequency as a center frequency.

Figure 3A:
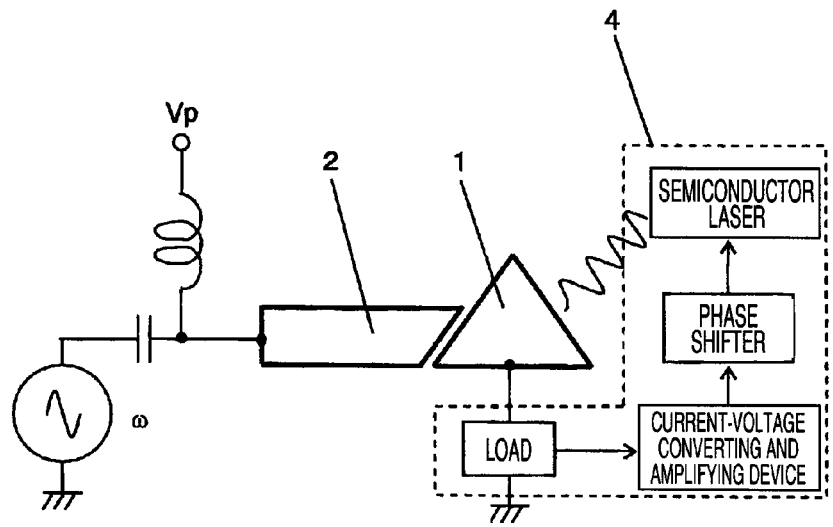
FIG. 3A is a diagram illustrating a resonator according to a first embodiment of the invention that performs modulation on a spring property by using light and FIG. 3B is a diagram illustrating another resonator according to a first embodiment of the invention that performs modulation on a spring property by using light.

FIG. 3 shows an example of a structure of a resonator that is applied with an effect of increasing vibration amplitude using parametric resonance. In FIG. 3A, a modulating unit 4 is provided in series to the capacitor between the electrode 2 and the vibrator 1. In an alternating current that flows between the electrode 2 and the vibrator 1, its phase advances by 90° as compared with the voltage. That is, if the voltage becomes a sine wave (sin wave), the current becomes a cosine wave (cos wave). Further, the phase of the voltage is substantially equal to the phase of the electrostatic force. The current is detected as a load, the current is amplified, and the phase of the current is shifted, which modulates the intensity of the laser beam radiated from the semiconductor laser. The modulation frequency of the intensity of the laser beam becomes equal to an angular frequency ω of an alternating current signal source. In the vibrator 1, tension stress is generated in a longitudinal direction of the beam. If the laser beam is radiated onto the resonator, when the laser beam is 'bright', the temperature raises, and thus tension stress is alleviated. Further, if the laser beam is radiated onto the resonator, when the laser beam is 'dark', the temperature falls, and thus the tension stress becomes stronger. Accordingly, the spring property of the vibrator 1 is modulated in accordance with the tension stress.

At this time, a motion equation of the vibrator is represented as Equation 3. When m is set as an equivalent mass of the vibrator and k is set as an equivalent spring constant of the vibrator at the time of non-modulation, a resonance angular frequency at the time of non-modulation satisfies the condition $\omega_0=(k/m)^{1/2}$. The Q indicates a Q value of the vibrator, x indicates a displacement of the vibrator, and F sin ωt indicates an external force, which represents an electrostatic force by an alternating current signal at an angular frequency ω. The modulated spring constant is represented as $m\omega_0^2 \epsilon \cos(\omega t+\phi)$ that is an increment from a spring constant $k=m\omega_0^2$ at the time of non-modulation. In this case, ε indicates the depth of modulation.

$$m\ddot{x} + \frac{m\omega_0}{Q}\dot{x} + m\omega_0^2\{1 + \epsilon\cos(\omega t + \phi)\}x = F\sin\omega t \quad \text{[Equation 3]}$$

Figure 4A:
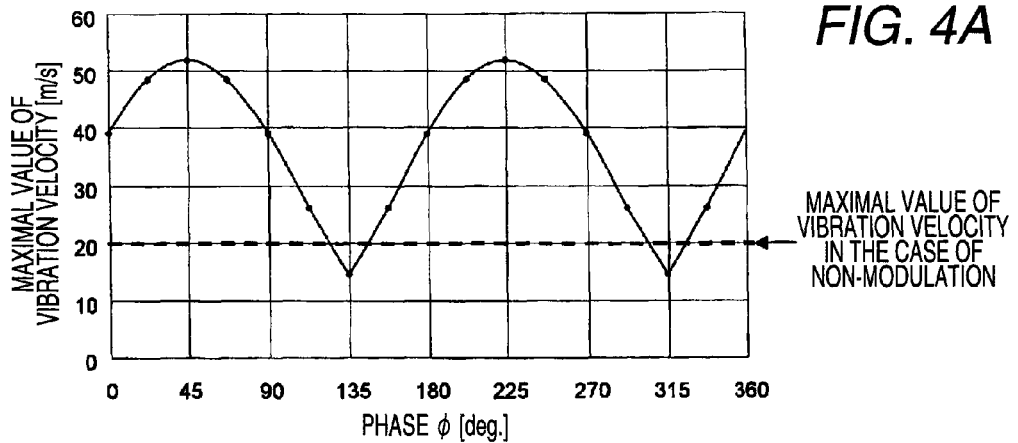
FIG. 4A is a diagram illustrating a relationship curve according to a first embodiment of the invention in a case where a velocity spectrum of a vibrator is measured, a longitudinal axis is set to indicate a maximum value (amplitude) of a vibration velocity and a horizontal axis is set to indicate a phase φ.
Figure 4B:
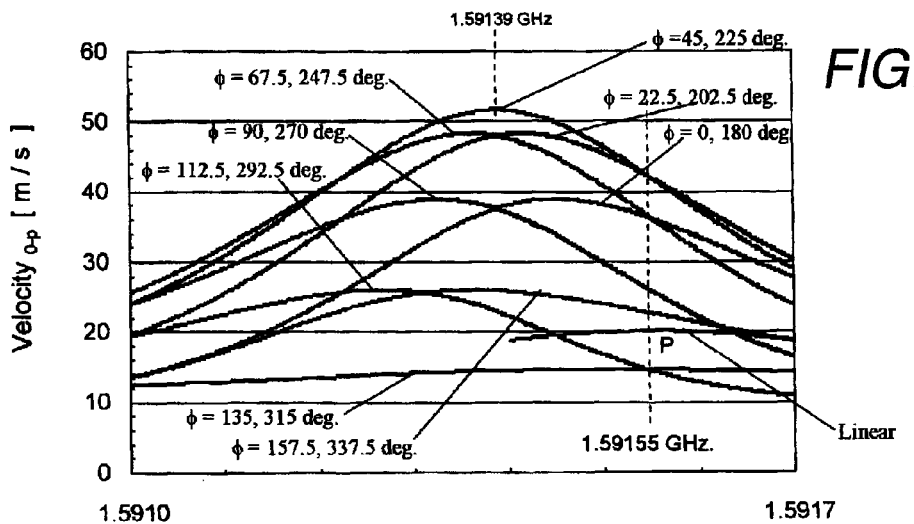
FIG. 4B is a diagram illustrating a frequency of an exciting force and a vibration velocity of a vibrator according to a first embodiment of the invention.

FIG. 4B shows a velocity spectrum of a vibrator when the conditions $F=10^{-9}$N, ε=0.035, and Q=2000 are set in the torsional resonator of FIG. 1. The spectrum at the time of non-modulation shown by 'Linear' becomes a peak value P of 20 m/s at a frequency of 1.59155 GHz. The spectrum of when modulation is applied to the spring property such that the phase φ varies is measured, and a relationship curve is shown in FIG. 4A in which a longitudinal axis is set to a maximal value (amplitude) of the vibration velocity and a horizontal axis is set to the phase ω. When the phase ω is 135° and 315° (=−450°), the velocity is reduced as compared with the 'Linear', but in a range of −22.5° (=337.50) to 112.5° or a range of 157.5° to 292.5°, the velocity is increased. The increase in the vibration velocity means the increase in the vibration amplitude.

Accordingly, in order to make the phase φ set in the ranges, it is possible to achieve a parametric resonance effect by adjusting an amount of shifted phase of the phase shifter in the modulating unit 4 of FIG. 3A. Further, if the depth ε of modulation is appropriately determined, nonlinearity does not exit in the spectrum of FIG. 4B, and a phenomenon, for example, a jump phenomenon of the spectrum, which is not desirable in the filter, does not occur. Furthermore, when the external exciting force F is zero, vibration also becomes zero. That is, an uncontrollable oscillation state does not occur.

Figure 4C:
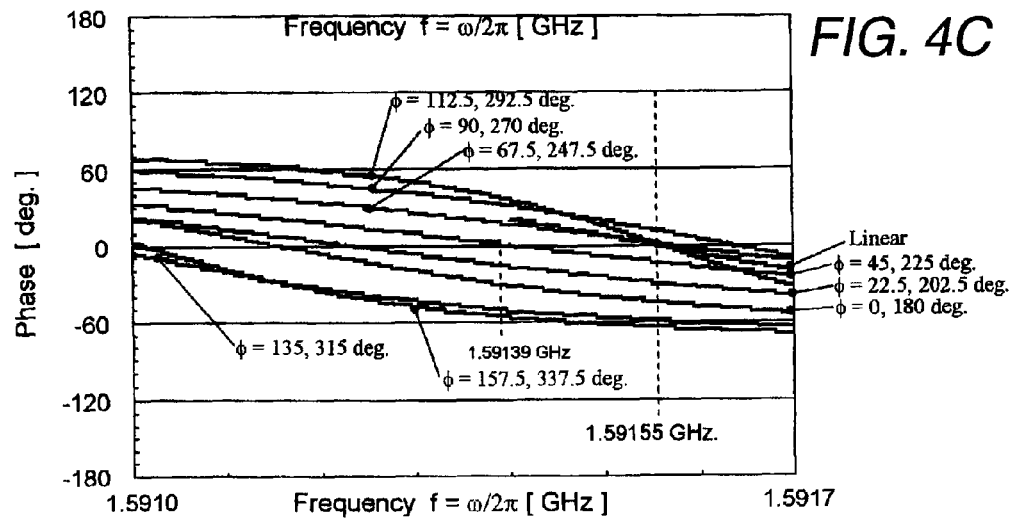
FIG. 4C is a diagram illustrating a relationship between a frequency of an exciting force and a phase of a vibrator according to a first embodiment of the invention.

By setting the phase φ to approximately 45° or 225°, a resonance peak is formed at a frequency of 1.59139 GHz, and at this time, it is possible to obtain a maximal peak value that can be achieved by setting only the phase φ. The maximal peak value is approximately 50 m/s, and it is possible to obtain a peak value that is 2.5 times as large as a peak value 20 m/s at the time of non-modulation. FIGS. 4B and 4C show a vibration velocity with respect to the frequency of the exciting force and the phase relationship thereof. In a general spring-mass system, the phase of the vibration velocity with respect to the exciting force becomes zero at a resonance point. However, if the parametric excitation is used, the peak frequency of FIG. 4B and a zero crossover frequency at the longitudinal axis 0 of FIG. 4C are not substantially equal to each other. However, when the phase φ is set to approximately 45° or 225°, the peak frequency of 1.59139 GHz in FIG. 4A and the zero crossover frequency in FIG. 4C are equal to each other. That is, the resonator can be handled as the same resonator as the resonator at the time of non-modulation where parametric excitation is not used. In FIG. 4B, a longitudinal axis indicates a velocity, and in FIG. 4C, a longitudinal axis indicates a phase.

Figure 5A:
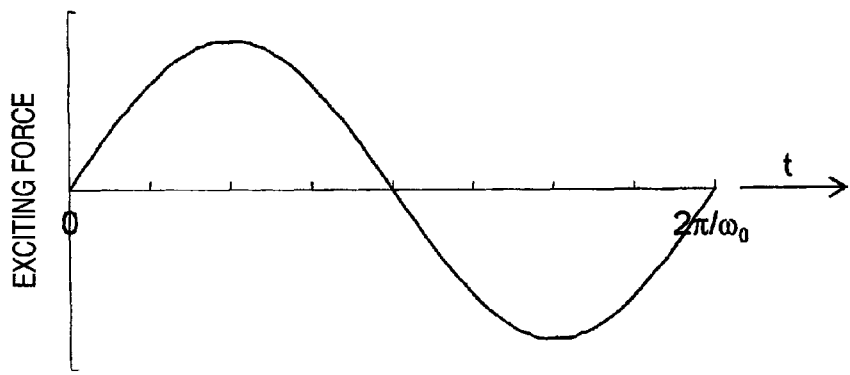
FIG. 5 is a diagram illustrating relationships among an exciting force, a location by vibration, and an increment of a spring property at the time of resonance.
Figure 5B:
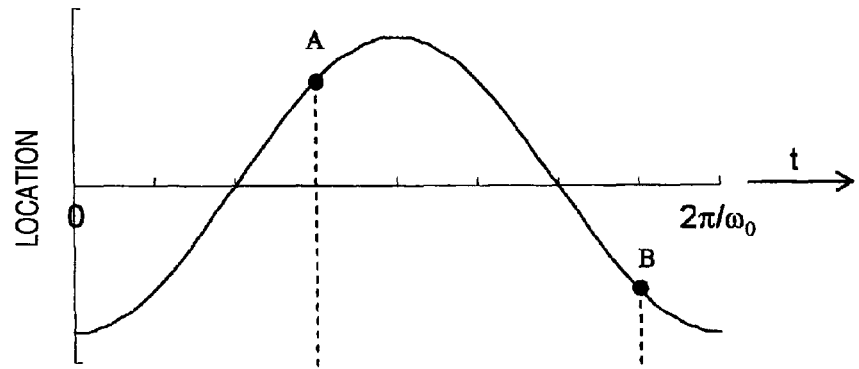
Figure 5C:
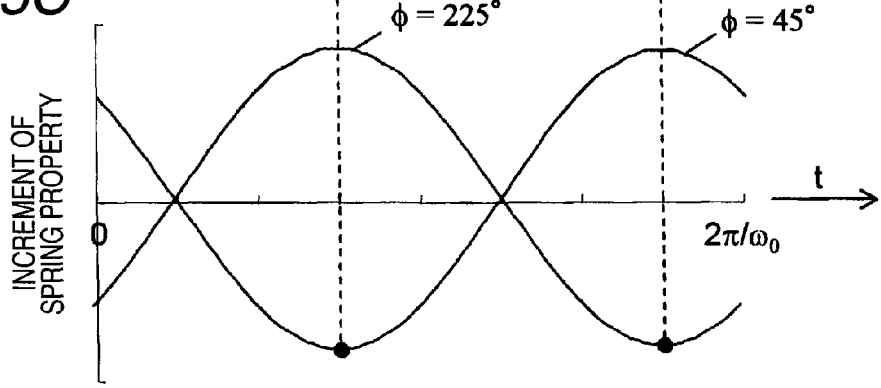

FIG. 5 shows the relationship between the location of the vibrator due to the exciting force and the vibration and the increment of the spring property when the phase φ is set to 45° or 225° and the frequency of the input alternating current signal is to 1.59139 GHz, that is, during resonance. At the time of φ=45°, when the location of the vibrator is at an A point away from the original point, the spring property becomes at its weakest, and the vibrator obtains large amplitude due to inertia. Even at the time of φ=225°, similarly, when the location of the vibrator is at an B point away from the original point, the spring property becomes at its weakest, and the vibrator obtains large amplitude due to inertia.

However, at the time of φ=45°, when the location of the vibrator is at an A point away from the original point, the spring property becomes weaker, but when the location of the vibrator is at an B point away from the original point, the spring property becomes stronger. Therefore, it is not possible to attain an effect of maximizing amplitude due to the inertia at the B point. Similarly, even at the time of =225°, it is not possible to attain an effect of maximizing amplitude due to the inertia at the A point.

In this embodiment, since the modulation on the spring property is performed by light, a method is used which is a non-contact type with respect to the vibrator. In the case, inhibition, which can be easily assumed in a contact type, does not occur during the vibration. Further, since the modulation on the spring property is performed by the light, it is possible to reduce a degree of the electrical noise of the modulating unit which directly interferes with the vibrator.

Further, this embodiment is different from a second embodiment in that the frequency of the exciting force is equal to the modulation frequency of the spring property. Therefore, it is possible to form a resonator with a simple structure.

Figure 3B:
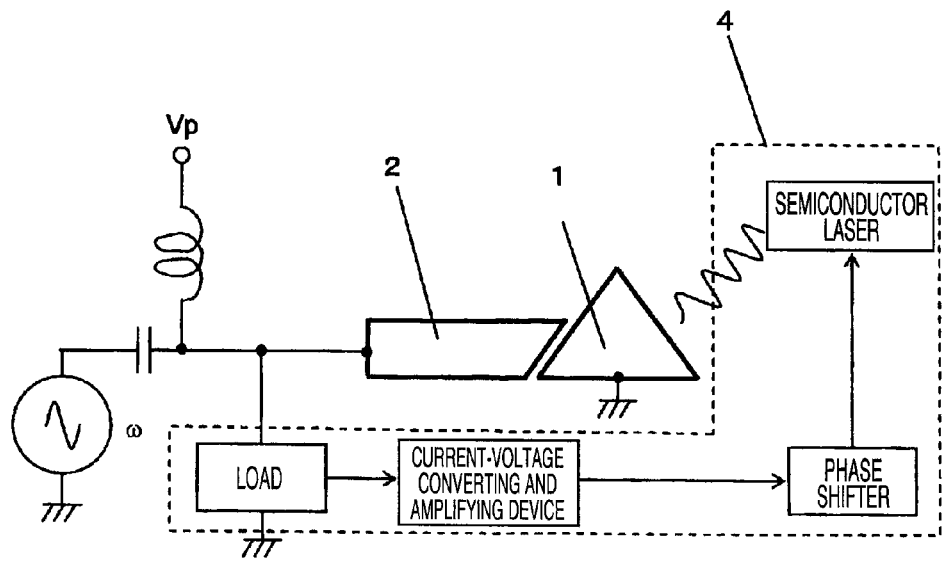

Further, as shown in FIG. 3B, the modulating unit 4 may be provided in parallel to the capacitor between the vibrator 1 and the electrode 2.

Further, the depth ε of the modulation can also be adjusted by a combination of the material of the vibrator 1 and the wavelength of the light that is radiated from the modulating unit 4. For example, if the infrared light is radiated onto the silicon vibrator, a most of the light energy is transmitted to the vibrator. In order to increase the depth ε of the modulation, a blue or ultraviolet light source that emits light having a short wavelength is used such that a larger amount of light energy is absorbed in the silicon vibrator. The absorbed light energy is converted into heat, which effectively reduce the spring property of the vibrator. That is, if the wavelength of the radiated light is changed, the modulation can be effectively performed. Alternatively, the modulation can be made by adjusting the phase.

Further, according to the first embodiment, in the modulation shown in FIG. 3, a semiconductor laser is used as the light source, but an inexpensive light emitting diode may be used as the light source.

Figure 6A:
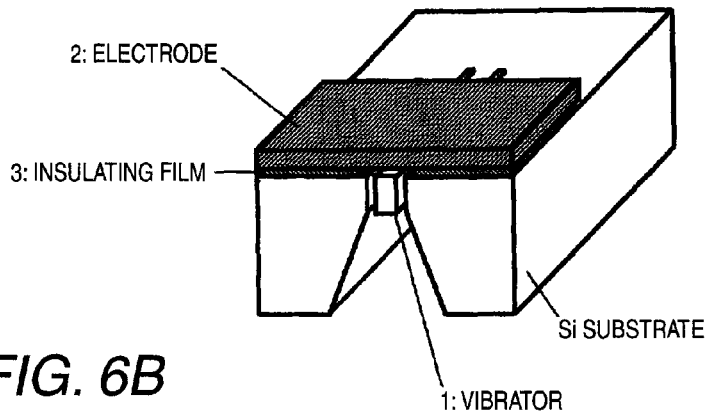
FIG. 6A is a diagram illustrating a structure of a resonator according to a first embodiment of the invention.
Figure 6B:
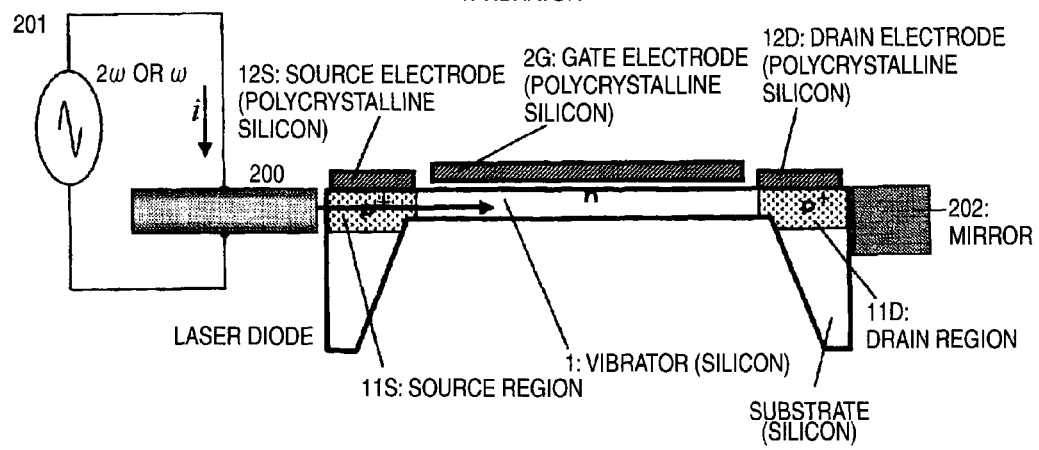
FIG. 6B is a diagram illustrating a structure of a resonator according to a first embodiment of the invention that radiates light in an axial direction of the vibrator so as to perform modulation on a spring property.

FIGS. 6A and 6B show an example where modulation on a spring property using light is effectively performed by using a semiconductor laser, as a modification of the first embodiment of the invention. In this example, in the resonator, a light radiating unit includes a laser diode 200 serving as a light source and a mirror 202. The light radiated from the laser diode 200 passes through the vibrator 1, is reflected on the mirror 202, and is incident on the vibrator 1. FIG. 6A is a perspective view of a resonator having a modulation function, when viewed from a section obtained by cutting the resonator such that a longitudinal section of the vibrator protrudes. FIG. 6B is a horizontal cross-sectional view of the same resonator. The vibrator 1 is a both-end supported beam that is formed by performing anisotropic etching on silicon, and the electrode 2 is formed at a predetermined gap on the vibrator 1. Both ends of the vibrator 1 form source and drain regions 11S and 11D, respectively. In addition, the electrode 2 is formed with respect to the vibrator 1 with an air layer (gap) therebetween, constitutes the gate electrode 2G, and forms an MOS transistor structure. Further, the gate electrode 2G is made of polycrystalline silicon. Further, on the source and drain regions 11S and 11D, source and drain electrodes 12S and 12D each made of polycrystalline silicon are formed, respectively.

As shown in FIG. 6B, on the side of the source region 11S, a laser diode 200 is disposed which is driven by an alternating current power supply 201, and on the side of the drain region 11D, the mirror 202 is disposed, such that modulation is made by the laser beam.

In this structure, a laser beam that is emitted from an emission end face of the laser diode 200 propagates to the inside of the vibrator in an axial direction. The modulation of the intensity of the laser beam is performed by modulating a current injected into a laser diode. The intensity of the laser beam is attenuated in the vibrator, and a portion of the laser beam is converted into heat in the vibrator 1. The laser beam that has passed through the vibrator 1 is reflected on the mirror 202 and propagates inversely to the inside of the vibrator 1, and the multi-reflection is repeated. By the reflection effect, in the vibrator 1, temperature variation in the longitudinal direction is reduced, which obtains an effect that the entire vibrator 1 is controlled to have an approximately constant temperature.

In this case, when using a structure in which the mirror 202 is not provided, in the vibrator, the temperature raises at the side where the laser diode is disposed, that is, the side of the source region 11S. In the longitudinal direction of the vibrator, the temperature variation occurs, which reduces an effect of modulating axial stress of the vibrator. Further, the light energy becomes unnecessary vibration energy, such as a compression wave, which propagates the inside of the vibrator in an axial direction, and may be consumed.

According to the above-described structure, even when a diameter of a light beam that is output from the laser diode is smaller than the length of the vibrator, it is possible to perform uniform temperature control over the entire vibrator.

As described above, according to the above-described structure, it is possible to reduce the variation in the temperature in the vibrator and modulate the temperature of the entire vibrator. As a result, it is possible to modulate the spring property of the vibrator without causing the unnecessary vibration due to the variation in the temperature. Accordingly, light can be efficiently radiated onto the vibrator. The spring property can be modulated by modulating the stress by means of energy (mainly, heat energy) by light radiation at a predetermined timing. Since the spring property is modulated by controlling the on/off characteristics of the light, the wavelength of the light, and the intensity of the light, the switching characteristic is excellent and the controllability of the modulation timing is excellent.

As such, in the resonator, the light radiating unit includes a laser diode that is provided at one end of the vibrator and a mirror that is provided at the other end of the vibrator. The light radiating unit radiates the laser beam from the one end of the vibrator to the other end of the vibrator along a longitudinal direction of the vibrator and performs an optical pumping. Since the modulating on the spring property is performed by radiating the laser beam, the modulation on the springing property can be performed with high controllability. Therefore, it is possible to achieve a parametric resonator with high efficiency.

Further, the peripheral portions of the vibrator 1 other than both ends of the vibrator 1 may be surrounded by a region (dielectric film or the like) having a refractive index smaller than that of the vibrator. According to this structure, it is possible to confine the light in the vibrator, and to modulate the light with high efficiency. Further, the air layer also contributes to the light confinement.

Figure 7:
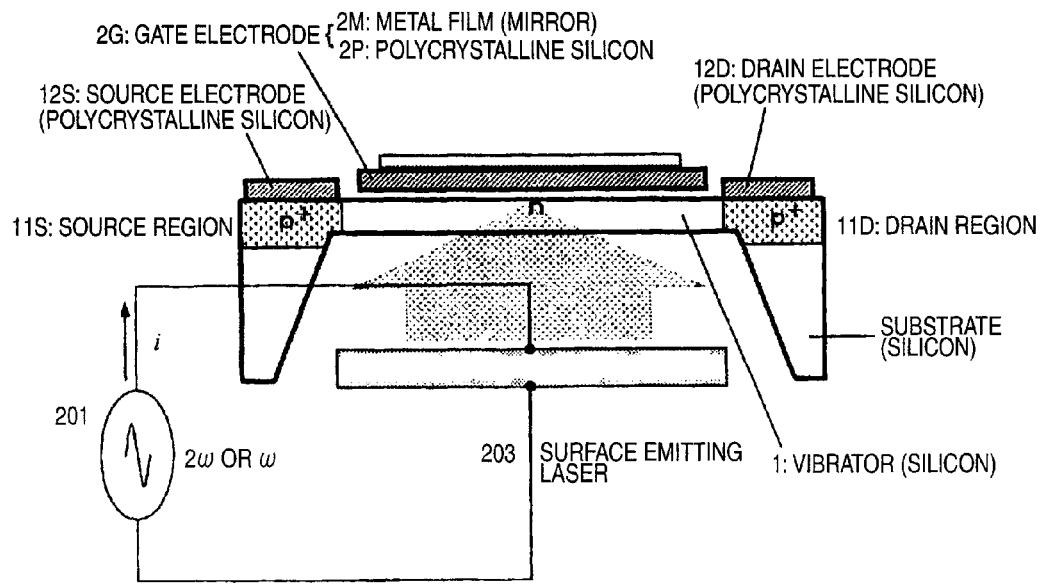
FIG. 7 is a diagram illustrating a structure in which light is radiated from a side of a vibrator so as to perform modulation on a spring property in accordance with a first embodiment of the invention.

Next, as another modification of the first embodiment of the invention, as shown in FIG. 7, the gate electrode 2G of the vibrator that forms the MOSFET structure shown in FIG. 6 has a polymetal structure, a metal film 2M made of a material, such as tungsten, is disposed on the polycrystalline silicon 2P so as to form a reflective surface, and the laser beam emitted from the surface emitting laser diode 203 is radiated from the side of the vibrator 1, that is, a surface opposite to the gate electrode 2G, such that it is reflected on the metal film 2M forming the gate electrode and propagates inversely to the inside of the vibrator.

Even in this structure, in the vibrator 1, the source and drain regions 11S and 11D are formed at both ends thereof, a longitudinal direction of the vibrator 1 is used as a channel, a gate electrode 2G is formed at predetermined gaps from the channel, and a reflective surface is formed which has a two-layered structure of polycrystalline silicon 2P and a metal film 2M.

According to this structure, the intensity of the light beam is attenuated in the vibrator, and a portion of the light beam is converted into heat in the vibrator. The light beam that has passed through the vibrator is reflected on the metal film 2M forming the gate electrode 2G, and propagates inversely to the inside of the vibrator.

Due to the reflection effect, in the vibrator, variation in temperature in the thicknesswise direction is reduced and thus the temperature of the entire vibrator is uniformly modulated. If the metal film 2M serving as the mirror is removed, the variation in temperature occurs in the vibrator in the thickness direction, such that the temperature of the entire vibrator is not uniformly modulated. Further, the light energy becomes unnecessary vibration energy, such as flexural vibration, which occurs due to the variation in temperature in the vibrator, and may be consumed. In the example shown in FIG. 7, it is possible to control the temperature of the entire vibrator when the diameter of the light beam is equal to or larger than the length of the vibrator.

As described above, the laser beam or the like is radiated from the rear surface side of the vibrator, that is, the facing surface side of the gate electrode. The beam that has passed through the vibrator is reflected on the metal film 2M forming the gate electrode, and light modulation can be uniformly performed with superior controllability over the entire vibrator in a longitudinal direction.

Next, a method of manufacturing a torsional resonator according to the first embodiment of the invention will be described with reference to FIG. 8. FIG. 8 shows a surface that corresponds to the section taken along the line A-A' of FIG. 1A. An SOI (Silicon On Insulator) substrate is used in which a single crystal silicon layer 32 having a predetermined carrier density and serving as a device forming layer is attached to the surface of the silicon substrate 30 with an oxide film 31 made of a silicon oxide film and interposed therebetween. When the beam structure is manufactured, a desired shape is achieved in the single crystal silicon layer 32 located at an upper side of the SOI substrate by means of anisotrophic etching using crystallite orientation (see Non-Patent Document 4).

Figure 8A:
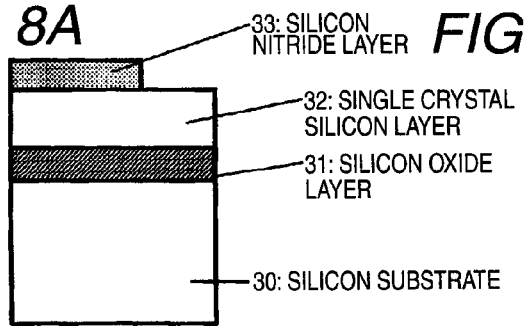
FIG. 8 is a diagram illustrating a method of manufacturing a torsional resonator according to a first embodiment of the invention.
Figure 8F:
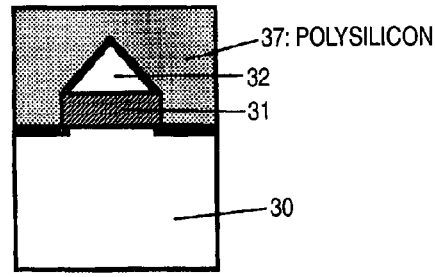

First, a silicon nitride film 33 is formed on the SOI substrate, and is then patterned (see FIG. 8A). When the silicon nitride film 33 is patterned, an edge of the pattern is formed along {110} of the silicon layer 32.

Figure 8B:
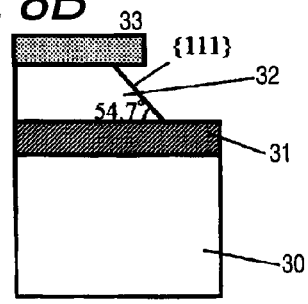

Next, anisotrophic etching is performed on the silicon layer 32 by using KOH. In the anisotrophic etching process of the silicon using the KOH, the etching speed of the {111} surface is smaller than those of the other surfaces. As a result, as shown in FIG. 8B, etching progresses such that the {111} surface is exposed. The positional relationship of 54.7° exists between the {100} and {111}.

In addition, in a state where the top surface of the SOI substrate is covered with the silicon nitride film 33, an oxidation process is performed. The {111} surface is locally protected by the silicon oxide film 35, and the silicon oxide film 33 is patterned again by using the silicon oxide film 35 as a mask.

Figure 8G:
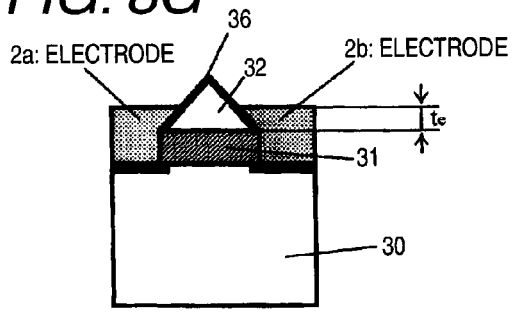
Figure 8C:
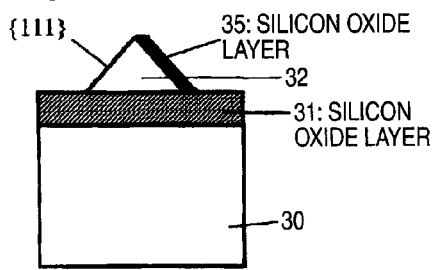
Figure 8H:
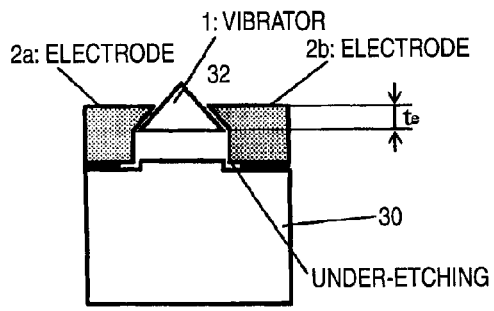
Figure 8D:
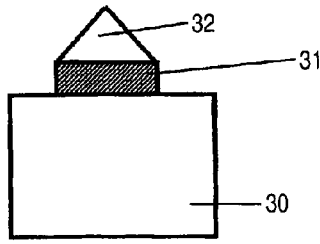

In addition, if the anisotrophic etching is performed on the silicon layer 32 using the KOH again, it is possible to obtain a silicon beam structure having a triangular section, as shown in FIG. 8C.

Next, by means of RIE (Reactive Ion Etching) using a $CHF_3$ gas, a $SiO_2$ film is processed. At this time, the silicon beam having a triangular shape becomes a mask, and the $SiO_2$ film below the beam remains without being etched.

Figure 8E:
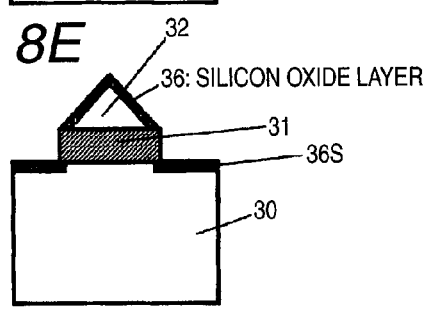

Next, the $SiO_2$ film, which functions as a sacrificial film 36 forming a gap between the beam and the electrode, is finally formed by the CVD method or the like, or is formed by oxidizing the surface of the beam having the triangular section using thermal oxidation or radical oxidation by low temperature plasma. FIG. 8E shows a state where a silicon surface is thermally oxidized by an oxidation furnace using the latter. At this time, the silicon oxide film 36S is formed on the surface of the silicon substrate 30, but may be formed to be slightly embedded below the silicon oxide layer 31.

Then, the polysilicon layer 37 as the electrode is deposited by a CVD (Chemical Vapor Deposition) method (see FIG. 8F), and etch back is performed by the RIE using a $CF_4$ gas. As shown in FIG. 8G, the top portion of the single crystal silicon layer 32, which forms the beam having the triangular section covered with the sacrificial layer 36, is exposed, and the thickness te of the electrode is adjusted.

Finally, the $SiO_2$ film serving as the sacrificial layer 36 present between the beam and the electrode and the silicon oxide film ($SiO_2$) 31 of the bottom surface of the beam are removed by a fluorinated acid, which enables the beam to enter a movable state. Since the silicon oxide film 36S is formed to be slightly embedded below the silicon oxide layer 31 under the single crystal silicon layer 32 that forms the beam having the triangular section, the embedded portion is removed by the etching process, which prevents a short circuit between the silicon substrate 30 and the electrodes 2a and 2b.

Further, the electrode 2 is provided below the bottom surface of the vibrator 1. However, a portion that substantially forms capacitance between the vibrator 1 and the electrode 2 is a portion in the electrode 2 having the thickness te or less. In order to not make a portion of the electrode 2 located below the bottom surface of the vibrator 1 formed, the electrode 2 may be formed on the $SiO_2$ layer 31 by omitting the process of FIG. 8D. If the $SiO_2$ layer 31 is removed by a fluorine acid in the process of FIG. 8H, the portion below the electrode 2 is also removed, an amount of under-etching in FIG. 8H drastically increases, and the electrode becomes flexible. At this time, since the vibrator 1 and the electrode 2 are fixedly attached to each other by an electrostatic force therebetween, the omission of the process (d) is effective only when the electrostatic force is very small.

Further, in the anisotrophic etching, instead of KOH, TMAH (Tetramethyl Ammonium Hydroxide) may be used.

[Non-Patent Document 4] G. Hashiguchi and H. Mimura, "Fabrication of Silicon Quantum Wires Using Separation by Implanted Oxygen Wafer", Jpn. J. Appl. Phys. Vol.33 (1994), pp. L1649-1650.

The process of FIG. 8 can form a minute structure that exceeds the limit of the patterning width in the semiconductor process, and is effective when manufacturing a minute resonator using frequencies in a range of several hundred MHz to several GHz.

Further, the oxide film between the beam and the vibrator is finally removed so as to form a capacitor. Therefore, it is possible to provide a resonator in which an electrostatic force is used as an exciting force.

Further, since the side of the beam is composed of a silicon crystal surface, it is possible to constitute a resonator in which surface quality is very smooth, surface loss due to the vibration is reduced, and a Q value is high.

Further, the resonator according to the embodiment of the invention is sealed in vacuum, and thus the vibration of the vibrator is not affected by the viscosity of the air, thus a resonator having large vibration amplitude is obtained.

Further, in this embodiment, the basic mode of the torsional vibration of the vibrator has been used. However, the invention is not limited thereto, and a higher-order mode, or other vibration modes, such as flexural vibration or longitudinal vibration, may be used.

Furthermore, in this embodiment, the section of the beam-typed vibrator is triangular, but the beam-typed vibrator may have a section that has a trapezoidal shape, a rectangular shape, a polygonal shape, and the like.

Second Embodiment

Next, a second embodiment of the invention will be described.

In the second embodiment, the torsional resonator according to the first embodiment shown in FIG. 1 is used. However, the modulation frequency of the spring property of the vibrator is two times as much as the frequency of the exciting force due to the electrostatic force.

Figure 9:
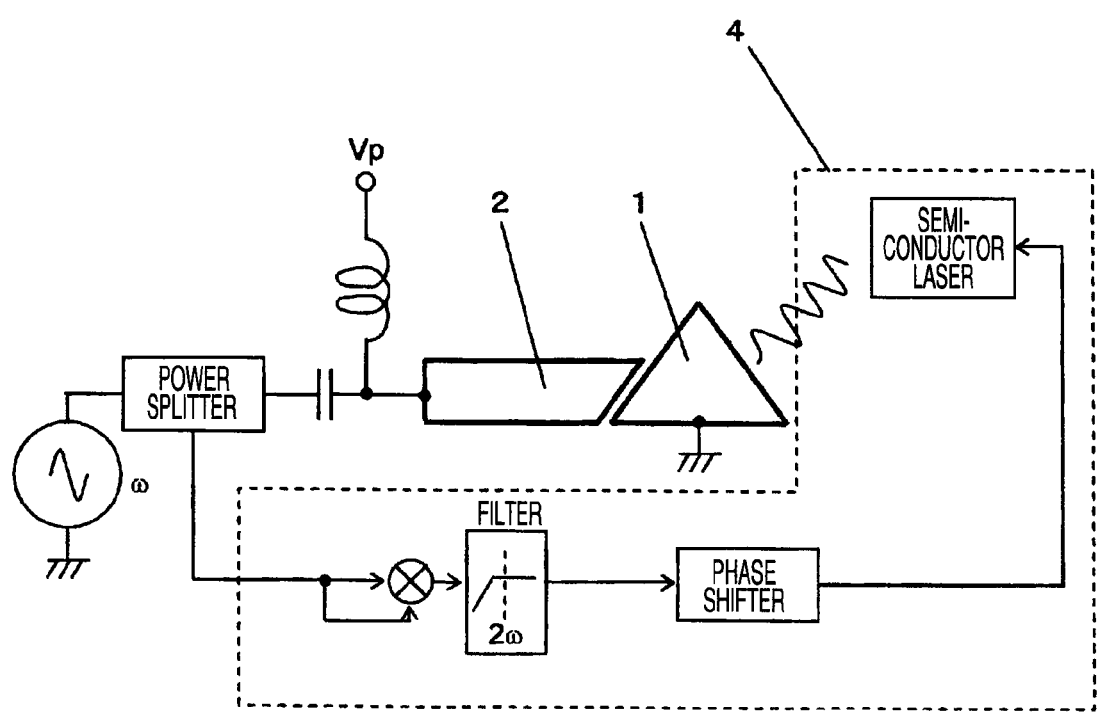
FIG. 9 is a diagram illustrating a resonator according to a second embodiment of the invention that performs modulation on a spring property by using light.

FIG. 9 is a diagram illustrating a structure of a resonator according to a second embodiment of the invention. The input signals having an angular frequency ω are separated by a power splitter. One of the input signals applies an exciting force caused by an electrostatic force between the vibrator 1 and the electrode 2, and the other is first converted into an angular frequency 2ω by a multiplication circuit in the modulating unit 4. Only a component of 2ω is selected by the filter, passes through the phase shifter, and modulates the intensity of the laser beam. The multiplication circuit can be composed of a non-linear element having square-law characteristics. The laser beam is radiated onto the vibrator 1, and modulates the spring property of the vibrator 1 having tension stress in the longitudinal direction of the beam at an angular frequency 2ω.

At this time, a motion equation of the vibrator is represented as Equation 4. When m is set as an equivalent mass of the vibrator and k is set as an equivalent spring constant of the vibrator at the time of non-modulation, a resonance angular frequency $\omega_0$ at the time of non-modulation satisfies the condition $\omega_0=(k/m)^{1/2}$. The Q indicates a Q value of the vibrator, x indicates a displacement of the vibrator, and F sin ωt indicates an external force, which represents an electrostatic force by an alternating current signal at an angular frequency ω. The spring constant that has been modulated at the angular frequency 2ω is represented as $m\omega_0^2\epsilon \cos(2\omega t+\phi)$ that is an increment from the spring constant $k=m\omega_0^2$ at the time of non-modulation. In this case, ε indicates the depth of modulation.

$$m\ddot{x} + \frac{m\omega_0}{Q}\dot{x} + m\omega_0^2\{1 + \varepsilon\cos(2\omega t + \phi)\}x = F\sin\omega t \quad \text{[Equation 4]}$$

Figure 10A:
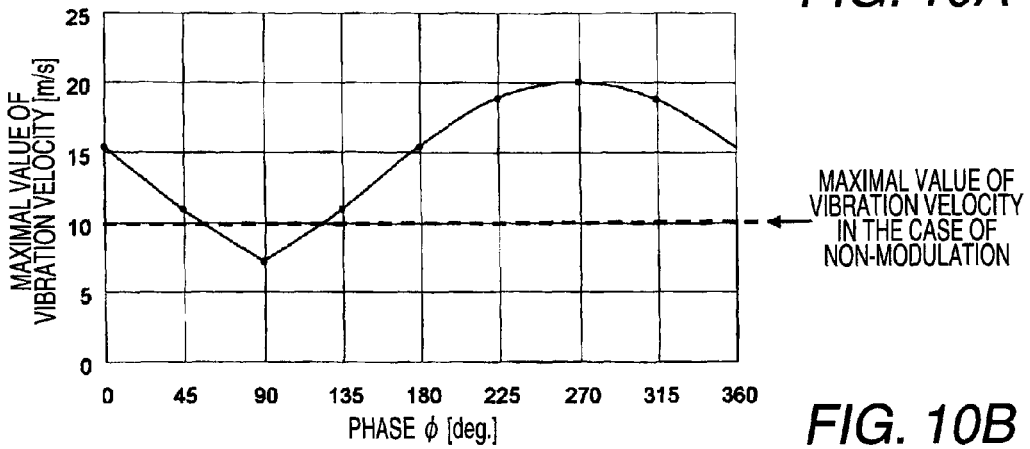
FIG. 10A is a diagram illustrating a relationship curve according to a second embodiment of the invention in a case where a spectrum of a frequency of an exciting force and a vibration velocity of a vibrator is measured, a longitudinal axis is set to indicate a maximum value (amplitude) of a vibration velocity and a horizontal axis is set to indicate a phase φ.
Figure 10B:
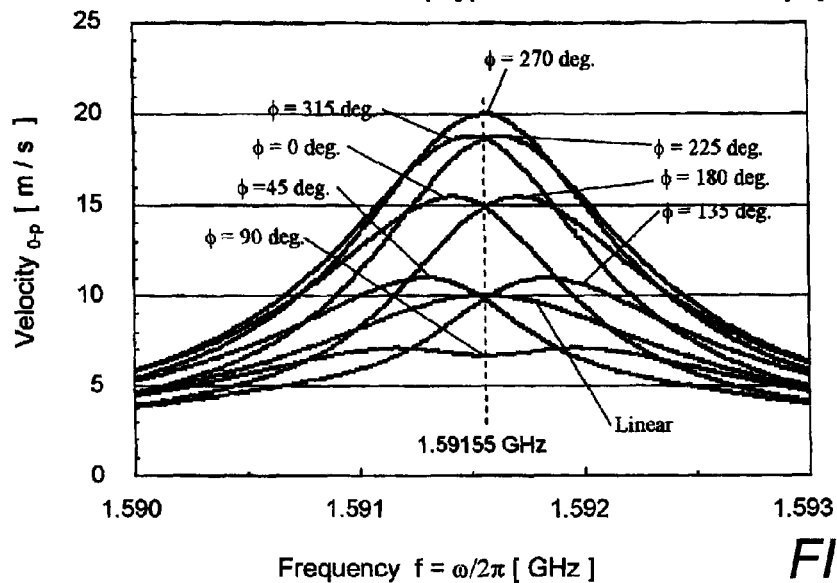
FIG. 10B is a diagram illustrating a frequency of an exciting force and a vibration velocity of a vibrator according to a second embodiment of the invention.

FIG. 10A shows a relationship curve in a case where a velocity spectrum of a vibrator when the conditions $F=10^{-9}N$, ε=0.001, and Q=1000 are set in the torsional resonator of FIG. 1 is measured, and a longitudinal axis is set to indicate a maximal value (amplitude) of a vibration velocity and a horizontal axis is set to indicate a phase φ. FIG. 10B shows a spectrum when modulation is applied to a spring property and the phase φ is varied. The spectrum in the case of non-modulation shown by 'Linear' becomes a peak value P of 10 m/s at a frequency of 1.59155 GHz. If the modulation is applied to the spring property, a peak frequency varies near a resonance frequency at the time of non-modulation. When the condition φ=90° is satisfied, the velocity is lowered as compared with the 'Linear', but in a range of −225° (=+135°) to 45°, the velocity is increased. The increase in the vibration velocity means the increase in the vibration amplitude. Accordingly, in order to make the phase φ set in the ranges, it is possible to obtain a parametric resonance by adjusting an amount of phase shift of the phase shifter in the modulating unit 4 of FIG. 9. Further, if the depth ε of modulation is appropriately determined, nonlinearity does not exit in the spectrum of FIG. 10B, and a phenomenon, for example a jump phenomenon of the spectrum, which is not desirable in the filter, does not occur. Furthermore, when the external exciting force F is zero, vibration also becomes zero. That is, it is possible to prevent an uncontrollable oscillation state from occurring.

By setting a phase φ appropriately to −90° (=+270°), a resonance peak is formed at a frequency of 1.59155 GHz, and at this time, it is possible to obtain a maximal peak value that can be achieved by setting only the phase φ. The maximal peak value is approximately 20 m/s, and it is possible to obtain a peak value that is two times a peak value 10 m/s at the time of non-modulation.

Figure 10C:
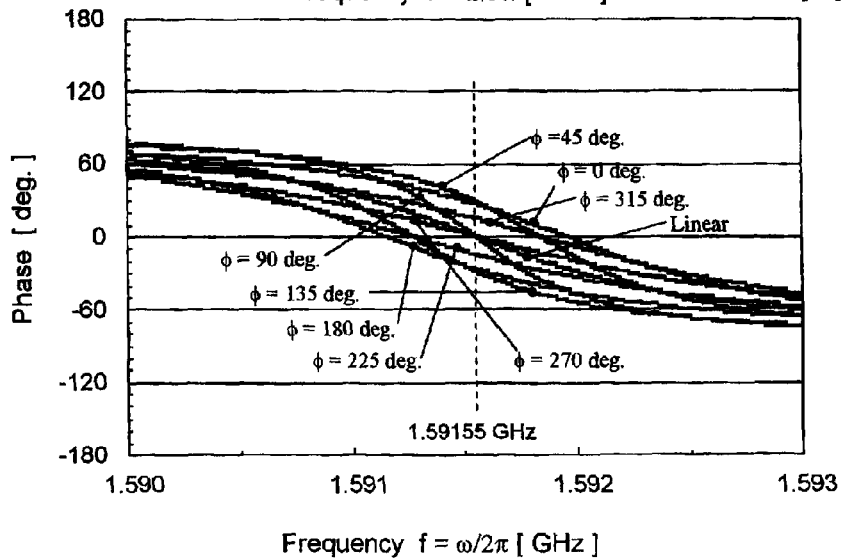
FIG. 10C is a diagram illustrating a relationship between a frequency of an exciting force and a phase of a vibration velocity of a vibrator according to a second embodiment of the invention.

FIGS. 10B and 10C show a vibration velocity with respect to the frequency of the exciting force and the phase relationship thereof. In a general spring-mass system, the phase of the vibration velocity with respect to the exciting force becomes zero at a resonance point. However, if the parametric excitation is used, the peak frequency of FIG. 10B and a zero crossover frequency at the longitudinal axis 0 of FIG. 10C are not substantially equal to each other. However, when the phase φ is set approximately to −90°, the peak frequency of 1.59155 GHz shown in FIG. 10B and the zero crossover frequency shown in FIG. 10C are equal to each other. That is, it can be equally treated with the resonator at the time of non-modulation when the parametric excitation is not used. Further, the resonance frequency is equal to the resonance frequency at the time of non-modulation. Accordingly, the resonance frequency can be designed to become the resonance frequency of the vibrator at the time of non-modulation.

FIG. 11 shows the relationship between the location of the vibrator due to the exciting force and the vibration and the increment of the spring property when the phase φ is set to −90° and the angular frequency ω of the input alternating current signal is set to a resonance angular frequency $\omega_0$. When the vibrator passes through the original point, the exciting force becomes maximal. Further, while the location of the vibrator is away from the original point and reaches the middle point of the maximal displacement, the spring property can be maximally reduced. Furthermore, while the location of the vibrator reaches from the maximal displacement to the original point, the spring property is maximally increased.

It means that the vibrator is applied with an effect like that when the location of the vibrator is away from the original point, the spring property is reduced, and the vibration displacement is increased due to inertia, and when the location of the vibrator becomes closer to the original point, the spring property becomes stronger, such that the vibration velocity increases. By this effect, the vibration amplitude at the time of resonance has a larger value, as compared with the case in which the spring property is not modulated.

Figure 11A:
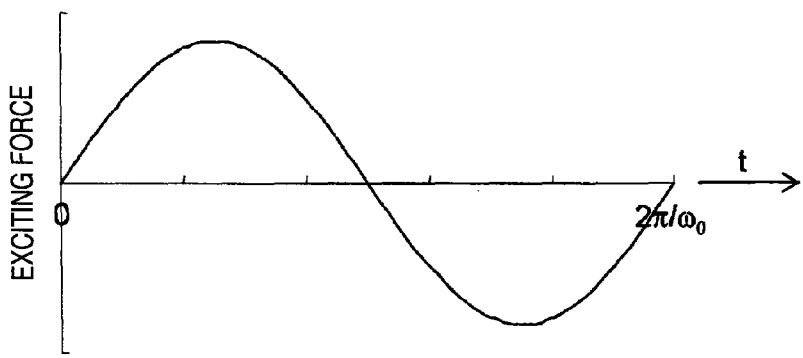
FIG. 11 is a diagram illustrating relationships among an exciting force at a resonance point, a vibration location, and an increment of a spring property according to a second embodiment of the invention.
Figure 11B:
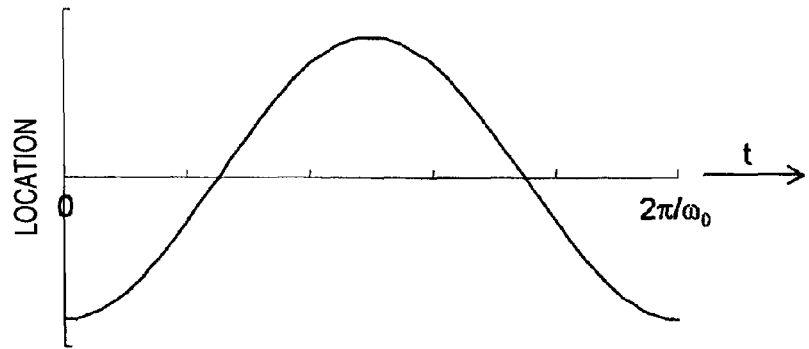
Figure 11C:
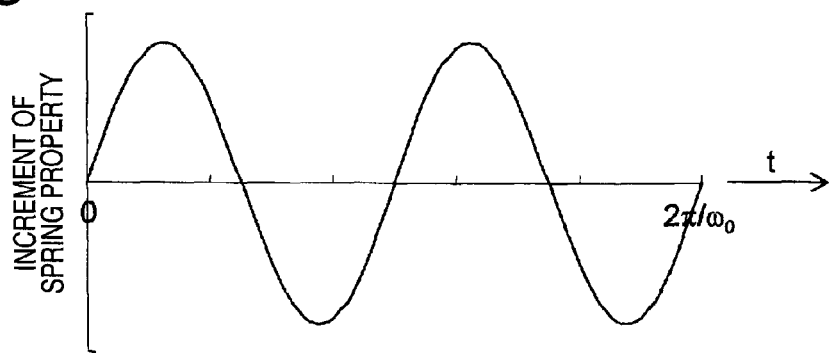
Figure 11D:
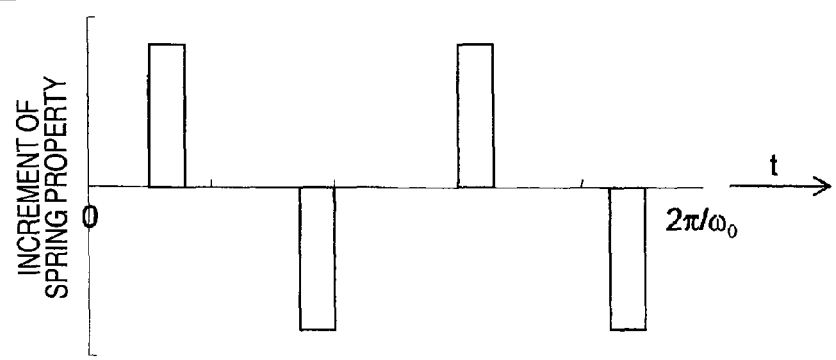

Further, the modulation of the spring property is not necessarily in accordance with a trigonometric function. As shown in FIG. 11(d), the modulation on the spring property may be intermittently performed.

Figure 12:
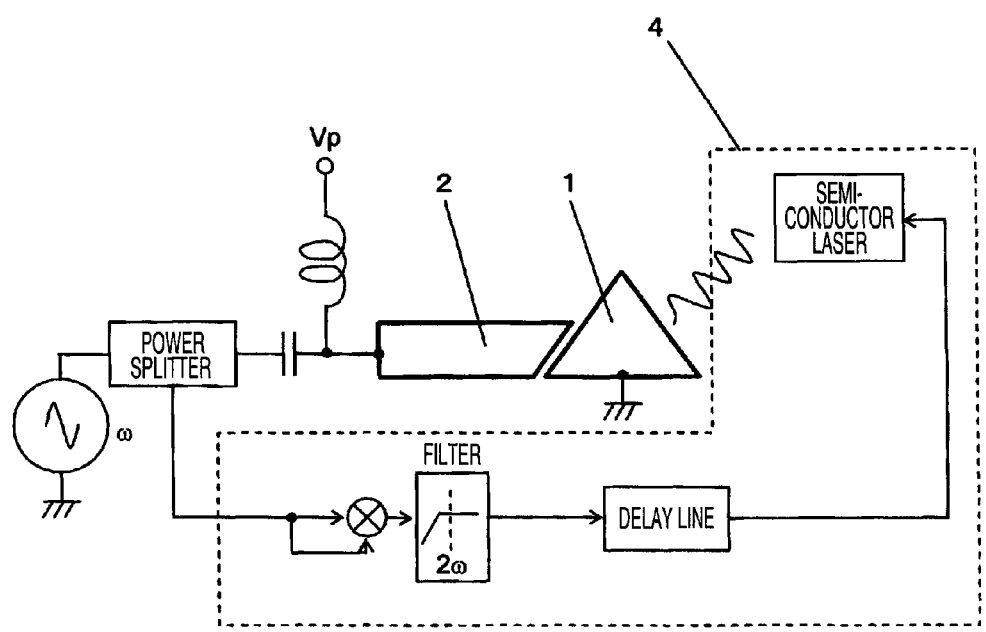
FIG. 12 is a diagram illustrating another resonator according to a second embodiment of the invention that performs modulation on a spring property by using light.

Next, another embodiment of the invention will be described. FIG. 12 shows a case where the phase shifter in the modulating unit 4 is replaced by a delay circuit in the structure shown in FIG. 9. The input signals having an angular frequency ω are separated by a power splitter. One of the separated input signals applies an exciting force due to an electrostatic force between the vibrator 1 and the electrode 2, and the other is converted into an angular frequency 2ω by a multiplication circuit in the modulating unit 4. In addition, only a component of the angular frequency 2ω is selected by the filter, passes through the delay circuit, and modulates the intensity of the laser beam. The laser beam is radiated onto the vibrator 1, and modulates the spring property of the vibrator 1 having tension stress in the longitudinal direction of the beam at an angular frequency 2ω.

At this time, a motion equation of the vibrator is represented as Equation 5. When m is set as an equivalent mass of the vibrator and k is set as an equivalent spring constant of the vibrator in case of non-modulation, a resonance angular frequency $\omega_0$ at the time of non-modulation satisfies the condition $\omega_0=(k/m)^{1/2}$. The Q indicates a Q value of the vibrator, x indicates a displacement of the vibrator, and F sin ωt indicates an external force, which represents an electrostatic force using an alternating current signal at an angular frequency ω. The spring constant that has been modulated at the angular frequency 2ω is represented as $m\omega_0^2\epsilon \cos 2\omega(t-D)$ that is an increment from the spring constant $k=m\omega_0^2$ at the time of non-modulation. In this case, ε indicates the depth of modulation, and D indicates a delay time.

$$m\ddot{x} + \frac{m\omega_0}{Q}\dot{x} + m\omega_0^2\{1 + \epsilon\cos 2\omega(t-D)\}x = F\sin\omega t \qquad \text{[Equation 5]}$$

Figure 13A:
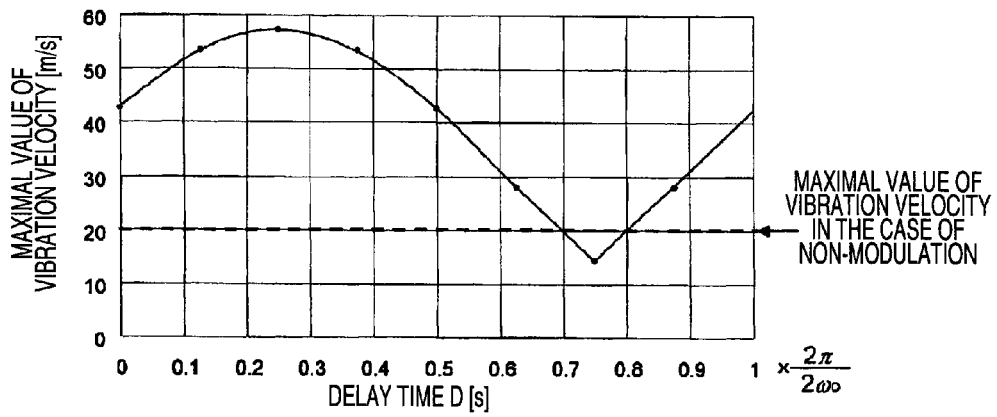
FIG. 13A is a diagram illustrating a relationship curve according to a second embodiment of the invention in a case where a spectrum of a frequency of an exciting force and a vibration velocity of a vibrator is measured, a longitudinal axis is set to indicate a maximum value (amplitude) of a vibration velocity and a horizontal axis is set to indicate a phase φ.
Figure 13B:
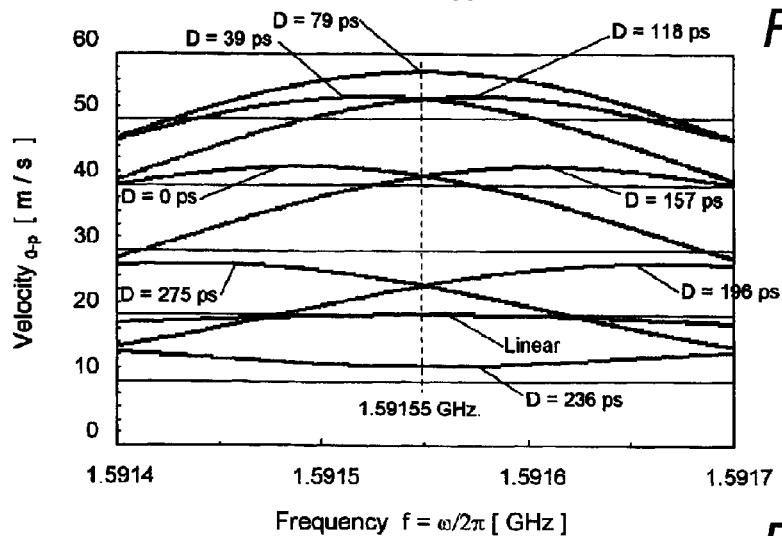
FIG. 13B is a diagram illustrating a frequency of an exciting force and a vibration velocity of a vibrator according to a second embodiment of the invention.
Figure 13C:
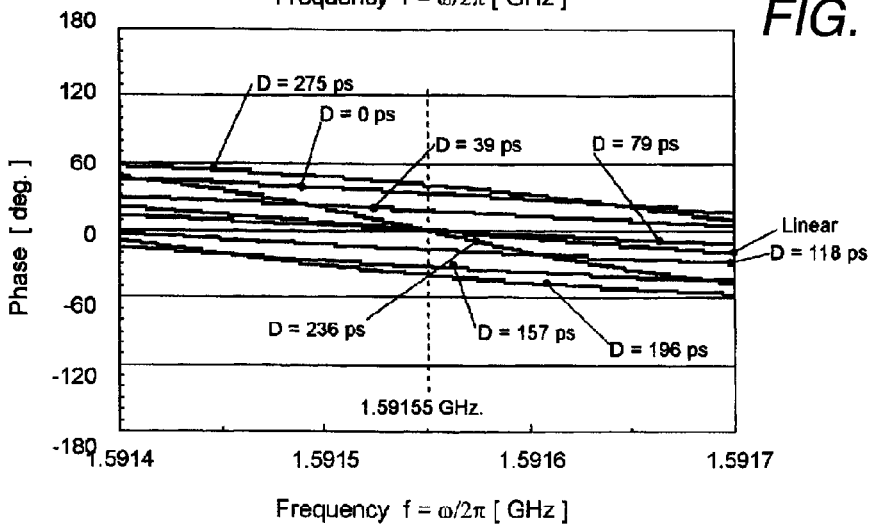
FIG. 13C is a diagram illustrating a relationship between a frequency of an exciting force and a phase of a vibration velocity of a vibrator according to a second embodiment of the invention.

FIG. 13A shows a relationship curve in a case where a velocity spectrum of a vibrator when the conditions $F=10^{-9}N$, $\epsilon=0.00065$, and $Q=2000$ are set in the torsional resonator of FIG. 1 is measured, and a longitudinal axis is set to indicate a maximal value (amplitude) of a vibration velocity and a horizontal axis is set to indicate a phase φ. FIGS. 13B and 13C show a relationship between a frequency of an exciting force and a vibration velocity of a vibrator and a relationship between the frequency of the exciting force and a phase of the vibration speed of the vibrator. The spectrum in case of non-modulation shown by 'Linear' in FIG. 13B has a peak value of 20 m/s at a frequency of 1.59155 GHz. There is shown the spectrum of when the modulation is applied to the spring property and the delay time (delay amount D) is varied. If the modulation is applied to the spring property, a peak frequency varies near a resonance frequency at the time of non-modulation. When D is 0.75 times as large as $2\pi/(2\omega_0)$, that is, D=236 ps, its velocity is lowered as compared with the 'Linear', but in a range of 0 to 0.625 times (0 to 196 ps) or a range of 0.875 to 1 times (275 ps or more), the velocity is increased. The increase in the vibration velocity means the increase in the vibration amplitude. Accordingly, in order to make the delay time D set in the ranges, it is possible to achieve an effect of parametric resonance by adjusting an amount of delay time of the delay circuit in the modulating unit 4 of FIG. 12. Further, if the depth ε of modulation is appropriately determined, nonlinearity does not exit in the spectrum of FIG. 13A, and a phenomenon, for example a jump phenomenon of the spectrum, which is not desirable in the filter, does not occur. Furthermore, when the external exciting force F is zero, vibration also becomes zero. That is, it is possible to prevent an uncontrollable oscillation state from occurring.

If the delay time D is set approximately to 0.25 times as large as $2\pi/(2\omega_0)$, that is, 79 ps, a resonance peak is formed at a frequency of 1.59155 GHz, and at this time, it is possible to obtain a maximal peak value that can be achieved by setting only the delay time D. The maximal peak value is approximately 60 m/s, and it is possible to obtain a peak value that is about three times as large as a peak value 20 m/s at the time of non-modulation.

In a general spring-mass system, the phase of the vibration velocity with respect to the exciting force becomes zero at a resonance point. However, if the parametric excitation is used, the peak frequency of FIG. 13B and a zero crossover frequency at the longitudinal axis 0 of FIG. 13C are not substantially equal to each other. However, when the delay time D is set approximately to 79 ps, the peak frequency of 1.59155 GHz shown in FIG. 13B and the zero crossover frequency shown in FIG. 13C are equal to each other. That is, it can be equally treated with the resonator at the time of non-modulation when the parametric excitation is not used. Further, the resonance frequency is equal to the resonance frequency at the time of non-modulation. Accordingly, the resonance frequency can be designed to become the resonance frequency of the vibrator at the time of non-modulation.

Figure 14:
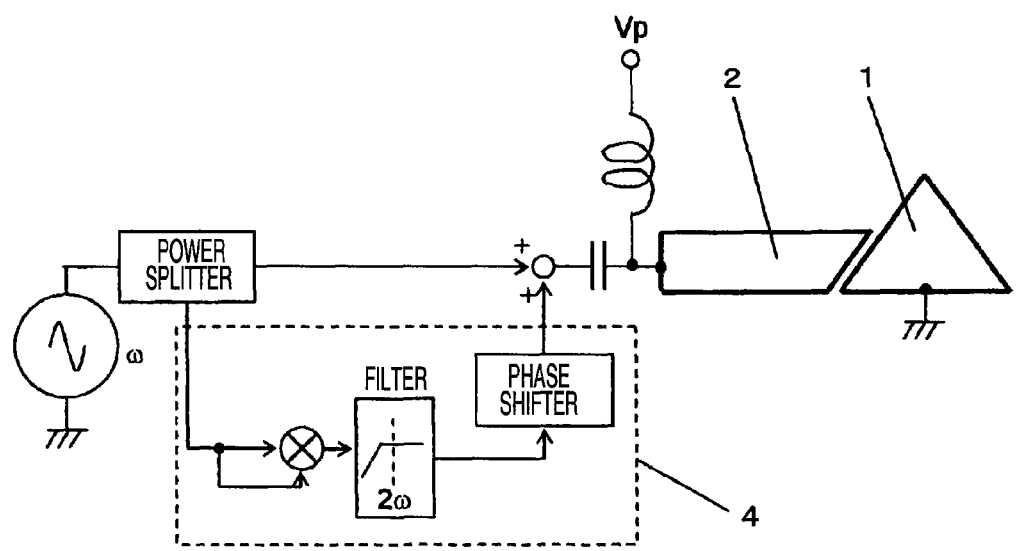
FIG. 14 is a diagram illustrating a resonator according to a second embodiment of the invention that performs modulation on a spring property by using Joule's heat.
Figure 15:
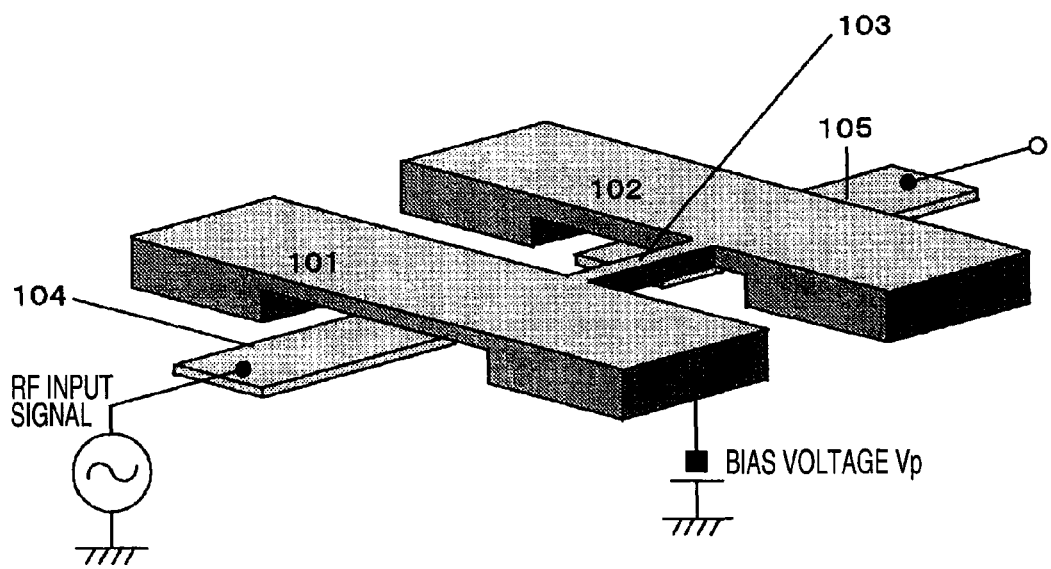
FIG. 15 is a schematic diagram illustrating a filter using a mechanical resonator according to the related art.
Figure 16:
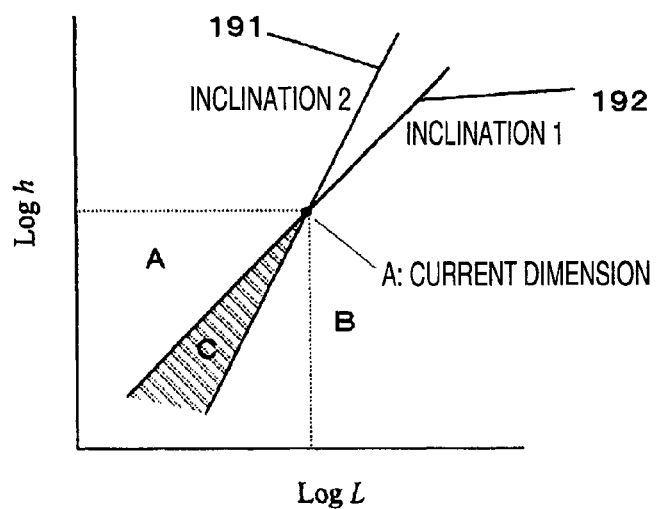
FIG. 16 is a characteristic view illustrating a relationship between a dimension of a mechanical resonator and a high frequency in an example of the related art.

Further, a means that applies modulation on the spring property in the non-contact type is not limited to light, but heating may be used in a non-contact type. That is, the means may be approximately selected. FIG. 14 is a diagram illustrating a resonator that applies Joule's heat to the vibrator and applies modulation on the spring property. The signal at the angular frequency 2ω that is generated in the modulating unit 4 is applied to the capacitor that is provided between the vibrator 1 and the electrode 2. As a result, the temperature of the vibrator 1 is modulated by Joule's heat at the angular frequency of 2ω, and the spring property is modulated. In order to make the relationship between the exciting force and the modulation of the spring property in accordance with the phase relationship shown in FIG. 11, if the amount of phase shift of the phase shifter in the modulating unit 4 is adjusted, the vibration can be amplified. Further, the temperature control means is not limited to Joule's heat, but an approximate means, such as heating at a high frequency or a Peltier element, may be used as the temperature control means.

Industrial Applicability

The resonator according to the embodiments of the invention is constructed such that a very minute structure, which can be manufactured by the semiconductor process, excites mainly due to the electrostatic force. Accordingly, it is possible to achieve a resonator in which the modulation degree of the spring property of the vibrator and the phase thereof can be specified, a characteristic, such as the non-linear jump, which is not preferable as the filter operation, can be prevented in the spectrum, and the vibration amplitude, which cannot not be effectively obtained by only excitation caused by the electrostatic force, can be obtained. As a result, it can be effectively used as a high frequency filter circuit that is integrated in the high density and loaded in a portable wireless terminal. Further, it can be applied to a medical or environmental field, such as a spectrum analysis in the sound band or an ultrasonic band, or a mass analysis by mechanical resonance.

What is claimed is:

1. A resonator, comprising:
   a vibrator that performs mechanical vibration;
   an exciting unit that applies an exciting force to the vibrator; and
   a modulating unit configured to cyclically vary a spring property of the vibrator according to a cycle of the exciting force,
   wherein the vibrator vibrates when the exciting force is applied to the vibrator from the exciting unit.

2. The resonator according to claim 1, wherein the modulating unit is configured to vary the spring property of the vibrator so as to increase a vibration amplitude of the vibrator.

3. The resonator according to claim 2, wherein a modulation frequency of the spring property of the vibrator is the same as a frequency of the exciting force from the exciting unit.

4. A resonator, comprising:
   a vibrator that performs mechanical vibration;
   an exciting unit that applies an exciting force to the vibrator; and
   a modulating unit configured to modulate a spring property of the vibrator according to a cycle of the exciting force from the exciting unit, wherein the vibrator vibrates when the exciting force is applied to the vibrator from the exciting unit;

wherein a modulation frequency of the spring property of the vibrator is the same as a frequency of the exciting force from the exciting unit;

wherein the exciting unit applies the exciting force to the vibrator such that a cyclic exciting force from the exciting unit has a value proportional to sin ωt;

wherein the modulating unit modulates the spring property such that an increment of the spring property is in proportion to cos(ωt+φ); and wherein a phase φ is in a range of −22.5° to 112.5° or a range of 25 157.5° to 292.5°.

5. The resonator according to claim 4, wherein the phase φ is approximately 45° or 225°.

6. The resonator according to claim 1, wherein a modulation frequency of the spring property of the vibrator is two times as much as a frequency of the exciting force from the exciting unit.

7. A resonator, comprising:
a vibrator that performs mechanical vibration;
an exciting unit that applies an exciting force to the vibrator; and
a modulating unit configured to modulate a spring property of the vibrator according to the exciting force,
wherein the vibrator vibrates when the exciting force is applied to the vibrator from the exciting unit;
wherein a modulation frequency of the spring property of the vibrator is two times as much as a frequency of the exciting force from the exciting unit;
wherein the exciting unit applies the exciting force to the vibrator such that a cyclic exciting force from the exciting unit has a value proportional to sin ωt;
wherein the modulating unit modulates the spring property such that an increment of the spring property is in proportion to cos(2ωt+φ); and
wherein a phase φ is in a range of −225° to 45°.

8. The resonator according to claim 7, wherein the phase φ is approximately −90°.

9. The resonator according to claim 6, wherein, in a case where in the exciting unit, a cyclic exciting force has a value proportional to sin ωt and a resonance angular frequency of when the spring property is not modulated is $\omega_0$, the modulating unit modulates the spring property such that an increment of the spring property is in proportion to cos 2ω(t−D), and a delay time D is in a range of 0 to 0.625 times as large as $2\pi/(2\omega_0)$ or in a range of 0.875 to 1 times as large 25 as $2\pi/(2\omega_0)$.

10. The resonator according to claim 9, wherein the delay time D is approximately 0.25 times as large as $2\pi/(2\omega_0)$.

11. The resonator according to claim 1, wherein the exciting unit is an electrode which is located near the vibrator and converts a variation in voltage between the vibrator and the electrode into the exciting force applied to the vibrator.

12. A resonator, comprising:
a vibrator that performs mechanical vibration;
an exciting unit that applies an exciting force to the vibrator; and
a modulating unit that modulates a spring property of the vibrator;
wherein the vibrator vibrates when the exciting force is applied to the vibrator from the exciting unit;
wherein the modulating unit modulates the vibrator according to the exciting force; and
wherein the modulating unit includes a temperature control unit which controls a temperature of the vibrator, and the modulating unit modulates the spring property according to a variation in the temperature of the vibrator.

13. The resonator according to claim 12, wherein the temperature control unit generates the time variation in the temperature of the vibrator according to light radiation from a light radiating unit.

14. The resonator according to claim 12, wherein the temperature control unit includes a current control unit which controls an amount of current supplied to the vibrator, and controls the temperature of the vibrator using Joule heat.

15. The resonator according to claim 12, wherein the vibrator has fixed portions or supporting portions at two locations or more, and uses peripheral portions of the fixed portions or the supporting portions as vibration nodes.

16. The resonator according to claim 15, wherein the vibrator is a both-end supported beam.

17. The resonator according to claim 13, wherein the light radiating unit includes a light source and a mirror and is configured such that light emitted from the light source passes through the vibrator, is reflected on the mirror, and is incident on the vibrator.

18. The resonator according to claim 17, wherein the light radiating unit includes:
a laser diode which is provided at one end of the vibrator; and
a mirror which is provided at the other end thereof; and
wherein the light radiating unit radiates a laser beam from the one end of the vibrator to the other end thereof in a longitudinal direction of the vibrator and performs an optical pumping.

19. The resonator according to claim 18, wherein the vibrator is configured such that peripheral portions of the vibrator other than both ends thereof are surrounded by a region where a refractive index is smaller than a refractive index of the vibrator.

20. The resonator according to claim 17, wherein the vibrator has both ends where source and drain regions are formed, the longitudinal direction of the vibrator is used as a channel, a gate electrode is formed at a predetermined gap from the channel, and the gate electrode is made of a metal or a polycide metal to forms a reflective surface.

21. The resonator according to claim 1, wherein at least the vibrator is sealed in a vacuum.

22. A filter using the resonator according to claim 1.

* * * * *

UNITED STATES PATENT AND TRADEMARK OFFICE
CERTIFICATE OF CORRECTION

PATENT NO. : 7,880,364 B2
APPLICATION NO. : 11/668494
DATED : February 1, 2011
INVENTOR(S) : Kunihiko Nakamura et al.

It is certified that error appears in the above-identified patent and that said Letters Patent is hereby corrected as shown below:

In column 9, line 57, please delete "(= - 450°)" and instead insert --(= - 45°)--.

Signed and Sealed this
Twenty-eighth Day of June, 2011

David J. Kappos
*Director of the United States Patent and Trademark Office*